United States Patent
Sorabji et al.

(10) Patent No.: US 9,564,349 B2
(45) Date of Patent: *Feb. 7, 2017

(54) RAPID THERMAL PROCESSING CHAMBER WITH MICRO-POSITIONING SYSTEM

(71) Applicant: Applied Materials, Inc., Santa Clara, CA (US)

(72) Inventors: Khurshed Sorabji, San Jose, CA (US); Joseph M. Ranish, San Jose, CA (US); Wolfgang Aderhold, Cupertino, CA (US); Aaron M. Hunter, Santa Cruz, CA (US); Blake R. Koelmel, Mountain View, CA (US); Alexander N. Lerner, San Jose, CA (US); Nir Merry, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1130 days.

This patent is subject to a terminal disclaimer.

(21) Appl. No.: 13/656,158

(22) Filed: Oct. 19, 2012

(65) Prior Publication Data

US 2013/0043235 A1 Feb. 21, 2013

Related U.S. Application Data

(63) Continuation of application No. 12/611,958, filed on Nov. 4, 2009, now Pat. No. 8,314,371.

(Continued)

(51) Int. Cl.
*H01L 21/67* (2006.01)
*H01L 21/324* (2006.01)

(Continued)

(52) U.S. Cl.
CPC ......... *H01L 21/67259* (2013.01); *C23C 16/46* (2013.01); *H01L 21/324* (2013.01);

(Continued)

(58) Field of Classification Search
CPC ............. H01L 21/67259; H01L 21/324; H01L 21/681; H01L 21/68742; H01L 21/67115; H01L 21/68; H01L 21/6835; C23C 16/46; C23C 16/463

See application file for complete search history.

(56) References Cited

U.S. PATENT DOCUMENTS

| 5,740,062 A | 4/1998 | Berken et al. |
| 5,982,986 A | 11/1999 | Davenport |

(Continued)

FOREIGN PATENT DOCUMENTS

| JP | 07-0201952 | 8/1995 |
| JP | 10-223732 | 8/1998 |

(Continued)

OTHER PUBLICATIONS

Non-Final Office Action in U.S. Appl. No. 13/656,150 mailed Apr. 11, 2014, 9 pgs.

(Continued)

*Primary Examiner* — Jeffrie R Lund
(74) *Attorney, Agent, or Firm* — Servilla Whitney LLC

(57) ABSTRACT

Methods and apparatus for rapid thermal processing of a planar substrate including axially aligning the substrate with a substrate support or with an empirically determined position are described. The methods and apparatus include a sensor system that determines the relative orientations of the substrate and the substrate support.

20 Claims, 20 Drawing Sheets

Related U.S. Application Data

(60) Provisional application No. 61/112,008, filed on Nov. 6, 2008, provisional application No. 61/112,015, filed on Nov. 6, 2008.

(51) Int. Cl.
  *H01L 21/68* (2006.01)
  *H01L 21/687* (2006.01)
  *C23C 16/46* (2006.01)
  *H01L 21/683* (2006.01)

(52) U.S. Cl.
  CPC ........ *H01L 21/67115* (2013.01); *H01L 21/68* (2013.01); *H01L 21/681* (2013.01); *H01L 21/6835* (2013.01); *H01L 21/68742* (2013.01)

(56) References Cited

U.S. PATENT DOCUMENTS

| | | | |
|---|---|---|---|
| 6,709,218 B1 | 3/2004 | Freerks et al. | |
| 6,722,834 B1 | 4/2004 | Tepman | |
| 6,800,833 B2 | 10/2004 | Gregor et al. | |
| 7,107,125 B2 | 9/2006 | Yim et al. | |
| 7,135,185 B1 | 11/2006 | Weiner et al. | |
| 7,378,618 B1 | 5/2008 | Sorabji et al. | |
| 8,057,602 B2* | 11/2011 | Koelmel | H01L 21/67115 118/728 |
| 8,314,371 B2* | 11/2012 | Sorabji | H01L 21/67115 219/444.1 |
| 8,900,889 B2* | 12/2014 | Sorabji | H01L 21/67115 257/E21.529 |
| 9,390,950 B2* | 7/2016 | Sorabji | H01L 21/67115 |
| 2005/0191044 A1 | 9/2005 | Aderhold et al. | |
| 2007/0215049 A1 | 9/2007 | Aderhold et al. | |
| 2008/0141556 A1 | 6/2008 | Sorabji et al. | |
| 2008/0280453 A1* | 11/2008 | Koelmel | H01L 21/67115 438/758 |
| 2010/0133257 A1* | 6/2010 | Sorabji | H01L 21/67115 219/447.1 |
| 2012/0270166 A1 | 10/2012 | Sorabji et al. | |
| 2013/0043235 A1* | 2/2013 | Sorabji | H01L 21/67115 219/412 |
| 2013/0043632 A1* | 2/2013 | Sorabji | H01L 21/67115 269/55 |
| 2015/0050118 A1* | 2/2015 | Sorabji | H01L 21/67115 414/806 |

FOREIGN PATENT DOCUMENTS

| | | |
|---|---|---|
| JP | 2004-0031396 | 1/2004 |
| JP | 2008-0166706 | 7/2008 |
| JP | 2008-188727 | 8/2008 |
| KR | 10-1998-0063689 A | 12/1998 |
| KR | 2003-0044302 A | 6/2003 |
| KR | 10-2008-0055608 A | 6/2008 |

OTHER PUBLICATIONS

PCT International Search Report, PCT/US2009/063394 filed Nov. 5, 2009, 3 pgs.

PCT Written Opinion, PCT/US2009/063394 filed Nov. 5, 2009, 3 pgs.

\* cited by examiner

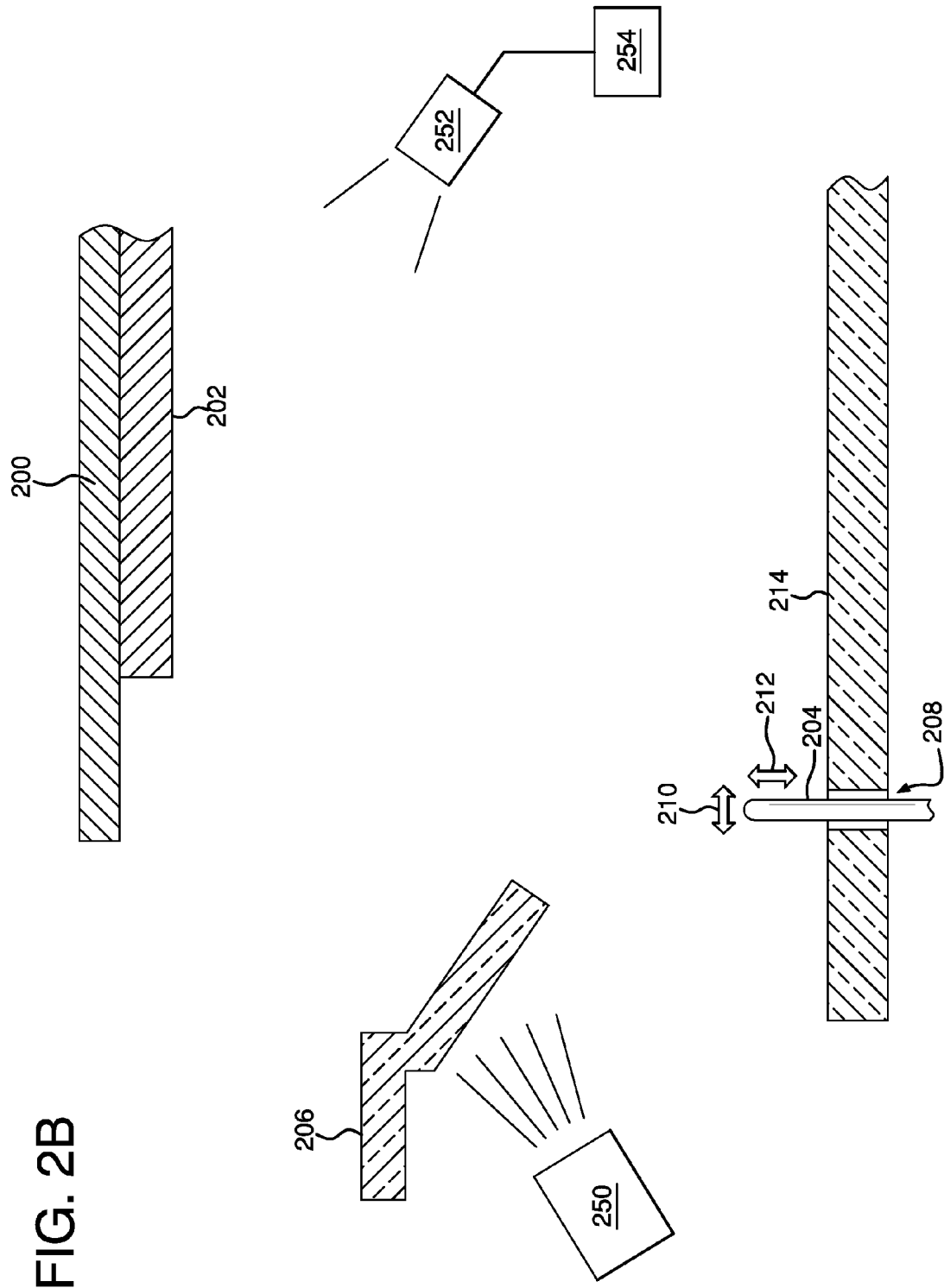

RAPID THERMAL PROCESSING CHAMBER WITH MICRO-POSITIONING SYSTEM

CROSS-REFERENCE TO RELATED APPLICATIONS

This application is a divisional under 35 U.S.C. §120 of U.S. patent application Ser. No. 12/611,958, filed Nov. 4, 2009 which claims priority under 35 U.S.C. §119(e) of U.S. Provisional Patent Application No. 61/112,008, filed Nov. 6, 2008 and U.S. Provisional Patent Application No. 61/112,015, filed Nov. 6, 2008.

TECHNICAL FIELD

Methods and associated apparatus for rapid thermal processing of substrates are disclosed. More specifically, apparatus and methods for rapid thermal processing of substrates including a micro-positioning system are disclosed.

BACKGROUND

Integrated circuits have evolved into complex devices that can include millions of transistors, capacitors and resistors on a single chip. The evolution of chip design requires faster circuitry and greater circuit density that demand increasingly precise fabrication processes.

Rapid thermal processing (RTP) generally includes heating from a radiant heat source, such as lamps and/or resistive heating elements. In a conventional RTP system, the substrate is heated to a desired temperature, and then the radiant heat source is turned off, which causes the substrate to cool. In some systems, a gas may flow onto the substrate to enhance cooling. However, as processing parameters continue to evolve, temperature ramp up and heating uniformity during RTP requires closer monitoring and control.

A frequently used process for treating substrates (also referred to herein as "wafers") is ion implantation. Ion implantation typically takes the substrates through a thermal process performed in a rapid thermal processing (RTP) chamber that provides a uniformly distributed thermal cycle that can heat the substrate from room temperature to approximately 450° C. to about 1400° C. In a conventional RTP system, robotic arm is used to transfer substrates to a structure that supports the substrates in the RTP chamber. The substrates need to be placed on the center of the structure to promote even heat distribution across the substrate surface. However, when substrates are transferred onto the structure, it is often that the positioning of the substrate on the ring structure cannot be accurately repeated. For example, the robotic arm may not be able to position consecutive substrates onto the same centered position on the structure. The difference in the positioning of the substrates may lead to uneven heat distribution across the substrate surface, therefore a decrease in production of the substrate.

Some rapid thermal processing apparatus use a substrate support in the form of an "edge ring" to support the substrate or wafer. As the name implies, the edge ring holds the substrate, typically called a wafer, around the edges only so as to minimize the contact with the substrate. If the wafer is not centered on the edge ring or other wafer support, uneven overlap on either side of the wafer create a side to side non-uniformity that rotates with the wafer (and wafer support). Robot placement accuracy is limited to ±0.007 inches. However, for every 0.001 inch that the wafer is placed off-center of the wafer support, the wafer can experience a 1° C. side-to-side temperature difference. Thus, in order to achieve temperature uniformity in the range of ±2° C., the wafer needs to be placed on the wafer support such that the wafer and wafer support are coaxial within ±0.002 inches.

Therefore, there is a need in the art for apparatuses and methods for the micro-positioning of a substrate or for precision control of the substrate on a wafer support in a rapid thermal processing chamber.

SUMMARY

Aspects of this invention involve the use of micro-positioning systems to coaxially align a substantially flat substrate with a substrate support in a rapid thermal processing chamber. This allows for more uniform heating across the substrate during processing.

According to one or more embodiments, it is possible to center the wafer on the substrate support by adjusting the position of one or more of the wafer, substrate support or an optional magnetically levitated rotor so the wafer is substantially coaxial with the substrate support. The substrate location with respect to the substrate support can be monitored by the position sensor systems which can provide feedback to a positioning mechanism to accurately and reproducibly achieve coaxial alignment of the substrate and substrate support.

In one embodiment, a rapid thermal processing apparatus for processing planar substrates comprises a chamber with a heat source and a first substrate support for holding the substrate in the chamber in a first position. A second substrate support, in a second position, is in the chamber for holding the substrate. In one embodiment, the second substrate support holds the substrate at the periphery during thermal processing. The second substrate support is moveable in a direction to place the substrate support closer or further from the heat source. A sensor to sense the position of the substrate relative to the second substrate support communicates with an actuator to change the position of the substrate relative to the position of the second substrate support within the plane of the substrate. As used herein, "within the plane of the substrate" refers to a plane substantially parallel to the flat surface of the substrate, for example, as in the x-y plane of a Cartesian coordinate system.

The sensor can be configured in a variety of ways. The sensor according to one or more embodiments includes an optical detector. The optical detector may include a light source to direct a light beam onto a surface of the substrate. The system may also include a detector positioned to monitor the intensity of light reflected from the substrate in response to the light beam. One or both the detector and the substrate may be moveable to provide relative motion between the detector and the substrate. In some embodiments, the sensor further comprises an electronic controller in communication with the detector, wherein the controller generates a plurality of measurements from reflections detected by the detector and calculates a location on the substrate surface where a reflection occurred, including determining which of the measurements corresponds to an edge of the substrate.

In some embodiments, the optical detector evaluates a shadow cast by either the second substrate support on the substrate or the substrate on the second substrate support to detect the position of the substrate relative to the position of the second substrate support.

An alternative sensor comprises a camera, an illumination system and a vision image analysis system which detects the centers of the second substrate support and substrate. In other embodiments, the sensor evaluates a shadow cast by either the substrate support onto the substrate, or the substrate onto the substrate support, to detect the position of the substrate relative to the position of the substrate support.

In a detailed embodiment, the first substrate support is selected from a robot blade and a lift pin assembly and the second substrate support is an edge ring. In specific embodiments, the chamber further comprises a chamber lid and at least two position sensors. The at least two position sensors being located on the chamber lid. A reflective light beam may optionally be transmitted from the at least two sensors through the chamber lid.

In some embodiments, the chamber further comprises liquid or gas jets positioned adjacent the substrate to move the substrate in a plurality of directions.

In various embodiments, the chamber further comprises a plurality of positioning rods oriented in the same plane as the substrate, the positioning rods being adapted to contact the edge of the substrate to push the substrate in a plurality of directions within the plane of the substrate.

Further embodiments comprise a mechanism adapted to move the substrate in a plurality of directions within the plane of the substrate. In some embodiments this is done by a plurality of positioning rods oriented in the same plane as the substrate, substrate support or a magnetically levitated rotor. The positioning rods are positioned to contact the edge of the substrate, substrate support or the magnetically levitated rotor. The rods being capable of pushing the substrate in a plurality of directions, for example in a plurality of directions parallel to the plane of the substrate.

According some embodiments, the substrate support is coupled to a magnetically levitated rotor. In detailed embodiments, the magnetically levitated rotor can be moved in a plurality of directions parallel plane of the substrate. In one or more embodiments, the magnetically levitated rotor is coupled to mechanism comprising a magnetic field generating device adapted to create a magnetic field coupled to the magnetically levitated rotor, the magnetic field being modifiable to move the levitated rotor in a plurality of directions parallel to the plane of the substrate.

According to some detailed embodiments, the chamber further comprises a magnetic field generating device coupled to the magnetically levitated rotor. The magnetic field being modifiable to move the levitated rotor in a plurality of axial directions within the plane of the substrate.

In some detailed embodiments, the chamber further comprises a system controller to obtain position signals from the sensor and to send a signal to one or more electromagnets to adjust the position of the second substrate support relative to the substrate.

In some specific embodiments, the second substrate support comprises an edge ring including an alignment mark on an inner surface of the substrate support to be aligned with a corresponding alignment mark on the substrate.

In one or more embodiments, the first substrate support comprises lift pins for transferring the substrate between a loading blade and the second substrate support. The lift pins may be adapted to pass through opening in the substrate support and contact and lift the substrate. In some embodiments, a mechanism adapted to move the lift pins within the substrate support holes without moving the axial position of the substrate support is incorporated.

The apparatus of one or more detailed embodiments is capable of accurately and reproducibly positioning the substrate support and substrate within about ±0.005 inches of being coaxial. In more detailed embodiments, the substrate and substrate support are positioned to be within about ±0.002 inches of being coaxial, or within about ±0.001 inches of being coaxial.

Another aspect of the invention is directed to a method of processing a substrate. The method comprises transferring a substrate into a processing chamber. The substrate is transferred to a set of lift pins. The location of the edge of the substrate is determined. The position of the substrate relative to a substrate support is adjusted so that the substrate and the substrate support are coaxial. The substrate is transferred to the substrate support. The substrate is then ready to be processed.

The order of these steps varies depending on the particular embodiment of use and should not be taken as a strict procedural sequence. In some embodiments, the relative position of the substrate with respect to the substrate support is adjusted prior to transferring the substrate onto the lift pins. In other embodiments, the relative position with respect to the substrate support is adjusted after transferring the substrate to the lift pins. In various embodiments, the relative position of the substrate with respect to the substrate support is adjusted by changing one or more of the location of the substrate, the location of the edge ring or the location of the lift pins.

One or more embodiments of the invention are directed to methods of processing a substrate. A planar substrate having an edge is transferred into a processing chamber onto an intermediate substrate support. The location of the edge of the substrate is determined. The position of the substrate relative to a second substrate support is adjusted so that the substrate and the second substrate support are in substantially centered orientation. The substrate is transferred to the second substrate support and the substrate is processed.

In detailed embodiments, the substrate is transferred into the processing chamber on a robot blade. The intermediate substrate support may comprise lift pins and the relative position of the substrate with respect to the second substrate support may be adjusted prior to transferring the substrate onto the lift pins.

In detailed embodiments, the relative position of the substrate with respect to the second substrate support may be adjusted by changing one or more of the location of the substrate, the location of the second substrate support or the location of the intermediate substrate support.

In some specific embodiments, the methods further comprise transmitting a reflective light beam from one sensor through a space between the substrate and the substrate support to determine a theta adjustment value for placing the substrate onto a center position of the second substrate support. In further detailed embodiments, the theta adjustment value is determined by measuring a distance from at least two positions X and Y between the second substrate support and the substrate and at least two sensors are used to determine the distance from the at least two positions X and Y for the theta adjustment.

In one or more embodiments, the position of the second substrate support is adjusted by applying one or more magnetic fields adjacent the substrate support. According to detailed embodiments, one or more sensors are in communication with a control system in communication with a plurality of magnets adjacent the substrate support, and the magnetic fields are applied in response to a position obtained by a sensor.

Although the foregoing refers to coaxial positioning, the invention(s) disclosed herein are not limited to coaxial positioning and may be used to position the substrate relative to the substrate support in any prescribed amount of axial position (for example, within ±7 mm) and any desired prescribed r, theta position. The geometric center of the substrate may not be the thermal center of the substrate. Also, due to variability of the substrate support, an optimum position (r, theta) may be determined for best thermal processing reproducibility, even though the wafer is not physically coaxial with the substrate support. Thus, embodiments of the invention can be used to ensure that the wafer is optimally positioned, even if that position is not physically coaxial with the substrate support.

BRIEF DESCRIPTION OF THE DRAWINGS

FIG. 2B shows a partial side view of a positioning system with sensor system for sensing the position of the substrate according to one embodiment;

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways.

The embodiments described below are generally directed to a RTP system including a micro-positioning system to axially align the substrate and the substrate support within the plane of the substrate. As used herein, rapid thermal processing or RTP refers an apparatus or a process capable of uniformly heating a wafer at rates of about 50° C./second and higher, for example, at rates of 100 to 150° C./second, and 200 to 400° C./second. Typical ramp-down (cooling) rates in RTP chambers are in the range of 80-150° C./second. Some processes performed in RTP chambers require variations in temperature across the substrate of less than a few degrees Celsius. Thus, an RTP chamber might include a lamp or other suitable heating system and heating system control capable of heating at rates of up to 100 to 150° C./second, and 200 to 400° C./second distinguishing rapid thermal processing chambers from other types of thermal chambers that do not have a heating system and heating control system capable of rapidly heating at these rates. In the embodiment shown, the RTP chamber optionally includes a substrate support that is adapted to levitate and rotate within the chamber without any contact with the inside walls of the chamber.

Figure 1:
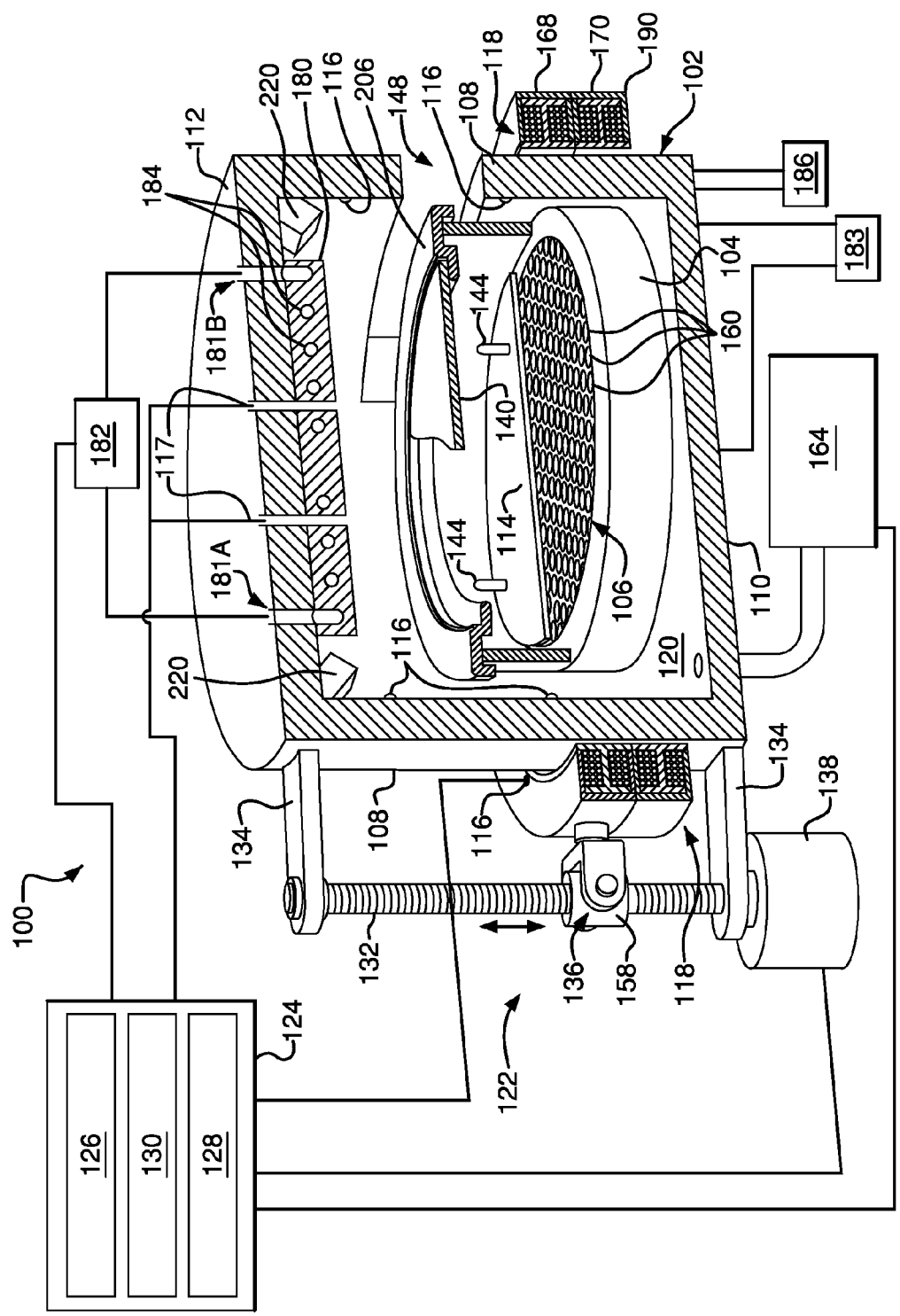
FIG. 1 shows a simplified isometric view of a rapid thermal processing chamber according to an embodiments of the invention.

Referring now to FIG. 1, an exemplary embodiment of a rapid thermal processing chamber 100 is shown. The processing chamber 100 includes a substrate support 104, a chamber body 102, having walls 108, a bottom 110, and a top or lid 112 defining an interior volume 120. The walls 108 typically include at least one substrate access port 148 to facilitate entry and egress of a substrate 140 (a portion of which is shown in FIG. 1). The access port may be coupled to a transfer chamber (not shown) or a load lock chamber (not shown) and may be selectively sealed with a valve, such as a slit valve (not shown), which seals the interior volume 120 from the surrounding atmosphere. In one embodiment, the substrate support 104 is annular and the chamber 100 includes a radiant heat source 106 disposed in an inside diameter of the substrate support 104. The radiant heat source 106 typically comprises a plurality of lamps. Examples of an RTP chamber that may be modified and a substrate support that may be used is described in U.S. Pat. No. 6,800,833 and United States Patent Application Publication No. 2005/0191044.

The RTP chamber 100 also includes a cooling block 180 adjacent to, coupled to, or formed in the top 112. Generally, the cooling block 180 is spaced apart and opposing the radiant heat source 106. The cooling block 180 comprises one or more coolant channels 184 coupled to an inlet 181A and an outlet 181 B. The cooling block 180 may be made of a process resistant material, such as stainless steel, aluminum, a polymer, or a ceramic material. The coolant channels 184 may comprise a spiral pattern, a rectangular pattern, a circular pattern, or combinations thereof and the channels 184 may be formed integrally within the cooling block 180, for example by casting the cooling block 180 and/or fabricating the cooling block 180 from two or more pieces and joining the pieces. Additionally or alternatively, the coolant channels 184 may be drilled into the cooling block 180.

The inlet 181A and outlet 181B may be coupled to a coolant source 182 by valves and suitable plumbing and the coolant source 182 is in communication with the controller 124 to facilitate control of pressure and/or flow of a fluid disposed therein. The fluid may be water, ethylene glycol, nitrogen (N2), helium (He), or other fluid used as a heat-exchange medium.

In the embodiment shown, the substrate support 104 is optionally adapted to magnetically levitate and rotate within the interior volume 120. The substrate support 104 shown is capable of rotating while raising and lowering vertically during processing, and may also be raised or lowered without rotation before, during, or after processing. This magnetic levitation and/or magnetic rotation prevents or minimizes particle generation due to the absence or reduction of moving parts typically required to raise/lower and/or rotate the substrate support.

The chamber 100 also includes a window 114 made from a material transparent to heat and light of various wavelengths, which may include light in the infra-red (IR) spectrum, through which photons from the radiant heat source 106 may heat the substrate 140. In one embodiment, the window 114 is made of a quartz material, although other materials that are transparent to heat and light may be used, such as sapphire. The window 114 may also include a plurality of lift pins 144 coupled to an upper surface of the window 114, which are adapted to selectively contact and support the substrate 140, to facilitate transfer of the substrate into and out of the chamber 100. Each of the plurality of lift pins 144 is configured to minimize absorption of energy from the radiant heat source 106 and may be made from the same material used for the window 114, such as a quartz material. The plurality of lift pins 144 may be positioned and radially spaced from each other to facilitate passage of an end effector coupled to a transfer robot (not shown). Alternatively, the end effector and/or robot may be capable of horizontal and vertical movement to facilitate transfer of the substrate 140.

In one embodiment, the radiant heat source 106 includes a lamp assembly formed from a housing which includes a plurality of honeycomb tubes 160 in a coolant assembly (not shown) coupled to a coolant source 183. The coolant source 183 may be one or a combination of water, ethylene glycol, nitrogen (N2), and helium (He). The housing walls 108, 110 may be made of a copper material or other suitable material having suitable coolant channels formed therein for flow of the coolant from the coolant source 183. The coolant cools the housing of the chamber 100 so that the housing is cooler than the substrate 140. Each tube 160 may contain a reflector and a high-intensity lamp assembly or an IR emitter from which is formed a honeycomb like pipe arrangement. This close-packed hexagonal arrangement of pipes provides radiant energy sources with high power density and good spatial resolution. In one embodiment, the radiant heat source 106 provides sufficient radiant energy to thermally process the substrate, for example, annealing a silicon layer disposed on the substrate 140. The radiant heat source 106 may further comprise annular zones, wherein the voltage supplied to the plurality of tubes 160 by controller 124 may be varied to enhance the radial distribution of energy from the tubes 160. Dynamic control of the heating of the substrate 140 may be affected by the one or more temperature sensors 117 adapted to measure the temperature across the substrate 140.

In the embodiment shown, an optional stator assembly 118 circumscribes the walls 108 of the chamber body 102 and is coupled to one or more actuator assemblies 122 that control the elevation of the stator assembly 118 along the exterior of the chamber body 102. In one embodiment (not shown), the chamber 100 includes three actuator assemblies 122 disposed radially about the chamber body, for example, at about 120° angles about the chamber body 102. The stator assembly 118 is magnetically coupled to the substrate support 104 disposed within the interior volume 120 of the chamber body 102. The substrate support 104 may comprise or include a magnetic portion to function as a rotor, thus creating a magnetic bearing assembly to lift and/or rotate the substrate support 104. In one embodiment, at least a portion of the substrate support 104 is partially surrounded by a trough (not shown) that is coupled to a fluid source 186, which may include water, ethylene glycol, nitrogen (N$_2$), helium (He), or combinations thereof, adapted as a heat exchange medium for the substrate support. The stator assembly 118 may also include a housing 190 to enclose various parts and components of the stator assembly 118. In one embodiment, the stator assembly 118 includes a drive coil assembly 168 stacked on a suspension coil assembly 170. The drive coil assembly 168 is adapted to rotate and/or raise/lower the substrate support 104 while the suspension coil assembly 170 may be adapted to passively center the substrate support 104 within the processing chamber 100. Alternatively, the rotational and centering functions may be performed by a stator having a single coil assembly.

An atmosphere control system 164 is also coupled to the interior volume 120 of the chamber body 102. The atmosphere control system 164 generally includes throttle valves and vacuum pumps for controlling chamber pressure. The atmosphere control system 164 may additionally include gas sources for providing process or other gases to the interior volume 120. The atmosphere control system 164 may also be adapted to deliver process gases for thermal deposition processes, thermal etch processes, and in-situ cleaning of chamber components.

The chamber 100 also includes a controller 124, which generally includes a central processing unit (CPU) 130, support circuits 128 and memory 126. The CPU 130 may be one of any form of computer processor that can be used in an industrial setting for controlling various actions and sub-processors. The memory 126, or computer-readable medium, may be one or more of readily available memory such as random access memory (RAM), read only memory (ROM), floppy disk, hard disk, or any other form of digital storage, local or remote, and is typically coupled to the CPU 130. The support circuits 128 are coupled to the CPU 130 for supporting the controller 124 in a conventional manner. These circuits include cache, power supplies, clock circuits, input/output circuitry, subsystems, and the like.

In one embodiment, each of the actuator assemblies 122 generally comprise a precision lead screw 132 coupled between two flanges 134 extending from the walls 108 of the chamber body 102. The lead screw 132 has a nut 158 that axially travels along the lead screw 132 as the screw rotates. A coupling 136 is coupled between the stator 118 and nut 158 so that as the lead screw 132 is rotated, the coupling 136 is moved along the lead screw 132 to control the elevation of the stator 118 at the interface with the coupling 136. Thus, as the lead screw 132 of one of the actuators 122 is rotated to produce relative displacement between the nuts 158 of the other actuators 122, the horizontal plane of the stator 118 changes relative to a central axis of the chamber body 102.

In one embodiment, a motor 138, such as a stepper or servo motor, is coupled to the lead screw 132 to provide controllable rotation in response to a signal by the controller 124. Alternatively, other types of actuators 122 may be utilized to control the linear position of the stator 118, such as pneumatic cylinders, hydraulic cylinders, ball screws, solenoids, linear actuators and cam followers, among others.

In embodiments that include the optional stator assembly 118, the chamber 100 may also include one or more sensors 116, which are generally adapted to detect the elevation of the substrate support 104 (or substrate 140) within the interior volume 120 of the chamber body 102. The sensors 116 may be coupled to the chamber body 102 and/or other portions of the processing chamber 100 and are adapted to provide an output indicative of the distance between the substrate support 104 and the top 112 and/or bottom 110 of the chamber body 102, and may also detect misalignment of the substrate support 104 and/or substrate 140.

The one or more sensors 116 are coupled to the controller 124 that receives the output metric from the sensors 116 and provides a signal or signals to the one or more actuator assemblies 122 to raise or lower at least a portion of the substrate support 104. The controller 124 may utilize a positional metric obtained from the sensors 116 to adjust the elevation of the stator 118 at each actuator assembly 122 so that both the elevation and the planarity of the substrate support 104 and substrate 140 seated thereon may be adjusted relative to and a central axis of the RTP chamber 100 and/or the radiant heat source 106. For example, the controller 124 may provide signals to raise the substrate support by action of one actuator 122 to correct axial misalignment of the substrate support 104, or the controller may provide a signal to all actuators 122 to facilitate simultaneous vertical movement of the substrate support 104.

The one or more sensors 116 may be ultrasonic, laser, inductive, capacitive, or other type of sensor capable of detecting the proximity of the substrate support 104 within the chamber body 102. The sensors 116, may be coupled to the chamber body 102 proximate the top 112 or coupled to the walls 108, although other locations within and around the chamber body 102 may be suitable, such as coupled to the stator 118 outside of the chamber 100. In one embodiment, one or more sensors 116 may be coupled to the stator 118 and are adapted to sense the elevation and/or position of the substrate support 104 (or substrate 140) through the walls 108. In this embodiment, the walls 108 may include a thinner cross-section to facilitate positional sensing through the walls 108.

The chamber 100 also includes one or more temperature sensors 117, which may be adapted to sense temperature of the substrate 140 before, during, and after processing. In the embodiment depicted in FIG. 1, the temperature sensors 117 are disposed through the top 112, although other locations within and around the chamber body 102 may be used. The temperature sensors 117 may be optical pyrometers, as an example, pyrometers having fiber optic probes. The sensors 117 may be adapted to couple to the top 112 in a configuration to sense the entire diameter of the substrate, or a portion of the substrate. The sensors 117 may comprise a pattern defining a sensing area substantially equal to the diameter of the substrate, or a sensing area substantially equal to the radius of the substrate. For example, a plurality of sensors 117 may be coupled to the top 112 in a radial or linear configuration to enable a sensing area across the radius or diameter of the substrate. In one embodiment (not shown), a plurality of sensors 117 may be disposed in a line extending radially from about the center of the top 112 to a peripheral portion of the top 112. In this manner, the radius of the substrate may be monitored by the sensors 117, which will enable sensing of the diameter of the substrate during rotation.

As described herein, the chamber 100 is adapted to receive a substrate in a "face-up" orientation, wherein the deposit receiving side or face of the substrate is oriented toward the top 112 and the "backside" of the substrate is facing the radiant heat source 106. The "face-up" orientation may allow the energy from the radiant heat source 106 to be absorbed more rapidly by the substrate 140 as the backside of the substrate is sometimes less reflective than the face of the substrate depending on the processing involved (i.e., Ni coating). Typically, the "face-up" orientation, being unpatterned, presents a more uniformly absorbing face to the radiation source.

Although the cooling block 180 and radiant heat source 106 is described as being positioned in an upper and lower portion of the interior volume 120, respectively, the position of the cooling block 180 and the radiant heat source 106 may be reversed. For example, the cooling block 180 may be sized and configured to be positioned within the inside diameter of the substrate support 104, and the radiant heat source 106 may be coupled to the top 112. In this arrangement, the quartz window 114 may be disposed between the radiant heat source 106 and the substrate support 104, such as adjacent the radiant heat source 106 in the upper portion of the chamber 100. Although the substrate 140 may absorb heat more readily and does absorb radiant energy more uniformly when the backside is facing the radiant heat source 106, the substrate 140 could be oriented in a face-up orientation or a face down orientation in either configuration.

According to one or more embodiments, positioning of the substrate with respect to the substrate support 104 is achieved by detection of the substrate position using a position sensor system 220 for sensing the position of the substrate relative to the second substrate support, for example, by detecting the edge of the generally planar substrate. Detection of the edge of the substrate can be accomplished in a variety of ways. The examples discussed below are not intended to limit the scope of the invention. Other substrate position sensor systems 220 are within the scope of the invention. For example, the specific substrate position sensor system may utilize an ultrasonic, laser, inductive, capacitive, or other type of sensor capable of detecting the position of the substrate relative to the substrate support.

Figure 2A:
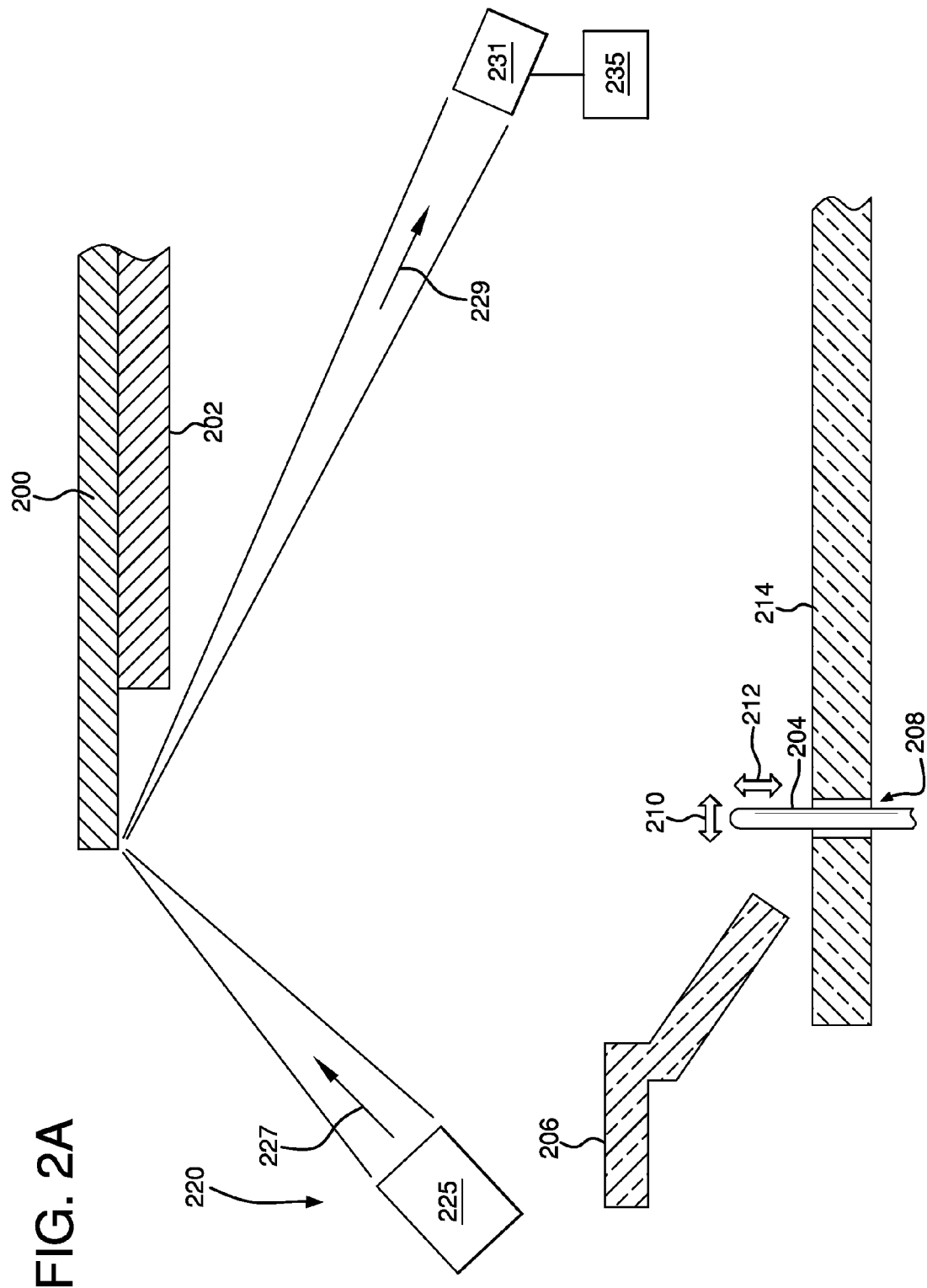
FIG. 2A shows a partial side view of a positioning system with a sensor system for sensing the position of the substrate according to one embodiment.

Exemplary substrate position sensor systems 220 are described in detail in U.S. Pat. No. 7,153,185 ("the '185 patent"). An example of a substrate position detection or sensor system 220 is shown in FIG. 2A. A light source 225 to direct a light beam 227 onto a surface of the substrate 200, which is reflected as a reflected beam 229. A detector 231 is positioned to monitor the intensity of light beam 229 reflected from the substrate 200. One or both the detector 231 and the substrate 200 may be moveable to provide relative motion between the detector 231 and the substrate 200. The sensor system 220 may further include an electronic controller 235 in communication with the detector, wherein the controller 235 is operable to generate a plurality of measurements from reflections detected by the detector 231.

The electronic controller 235 may include or be in communication with a general purpose programmable digital computer which receives the signals from the optical sensor system. The measurements can then be associated with radial positions with the plane of the substrate using a Cartesian x-y coordinate system.

Through an algorithm and/or empirically determined measurements, the electronic controller 235 can calculate a location on the substrate surface where a reflection occurred. Based on the nature of the reflection from the substrate surface, the controller may determine which of the measurements corresponds to an edge of the substrate. This may be determined by detecting a weak reflection from the substrate or no reflection at all. While the sensor system 220 is shown as being positioned below the substrate, it will be appreciated that the components may be advantageously positioned above the substrate, so as not to interfere with radiation delivered by the lamps or other heating elements to heat the substrate. In addition, the components of the sensor system 220 should be positioned to avoid interfering with the light pipes and temperature detection system which may include pyrometers.

Specific implementations of system 220 can include one or more of the following features. The light beam 227 can have a spot size of less than about one millimeter on the surface of the substrate. The system can further include a beam focusing optic including include a refractive optical element (e.g., a lens), a reflective optical element (e.g., a mirror), a diffractive optical element (e.g., a grating), and/or a holographic optical element (e.g., a holographic grating). The apparatus can further include a collimating optic positioned to collimate light reflected from the substrate surface prior to the reflected light being detected by the detector.

In another embodiment of an optical detector system, shown in FIG. 2B, an optical detection system may include a light source and detector 252 and is configured to evaluate a shadow cast by either the second substrate support on the substrate or the substrate on the second substrate support to detect the position of the substrate relative to the position of the second substrate support. In the embodiment shown in FIG. 2B, it will be apparent that detector 252 is positioned to detect a shadow on the substrate 200 cast by the substrate support (edge ring) 206. It will be appreciated that the light source 250 and detector 252 could be positioned above the substrate 200 and substrate support 206 to detect a shadow cast by the substrate 200 on the substrate support 206.

In another variant of an optical detection system the light source or other suitable illumination system 250 can cooperate with detector 252, which may be a camera, which is communication with a vision analysis system 254. Vision analysis system 254, which may include empirical data and/or lookup tables and include a general purpose computer can be used to detect the centers of the substrate support 206 and the substrate 200.

Each of the optical systems described above, or any other suitable method for detecting or sensing the relative positions of the substrate and the wafer support can be used together with a system for moving one or both of the substrate support and the substrate. Exemplary embodiments of such systems will be described further below.

The individual components of the position sensor systems 220 described above may be mounted in the top or lid 112 of the processing chamber. The sensor components may be positioned in different locations along the X and Y axis of the chamber to assist in detecting the center position of the wafer. Alternatively, the components of the sensor system 220 may be placed in the sidewalls of the processing chamber.

Figure 3A:
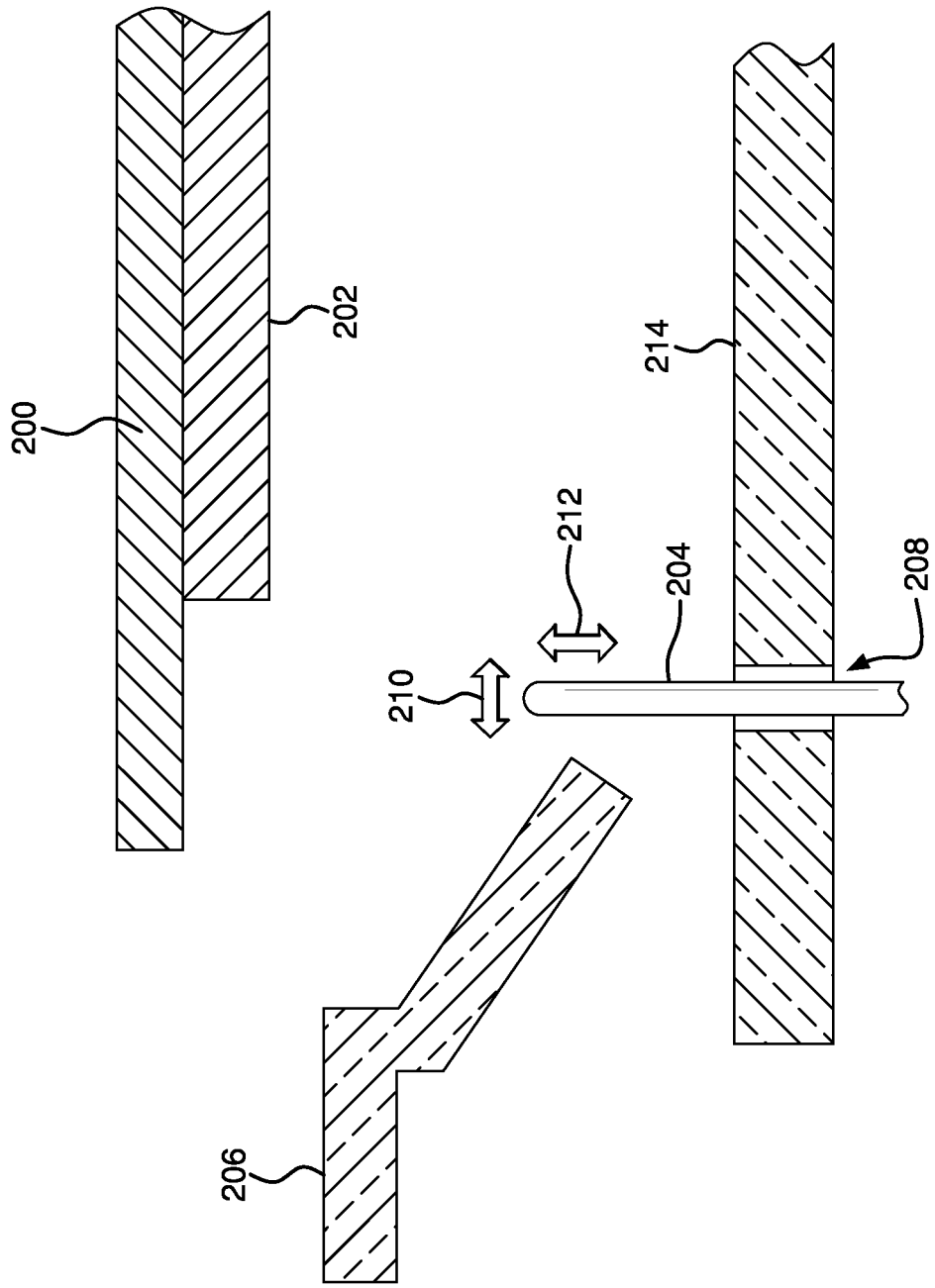
FIG. 3A shows a partial side view of a positioning system according to one embodiment.
Figure 3B:
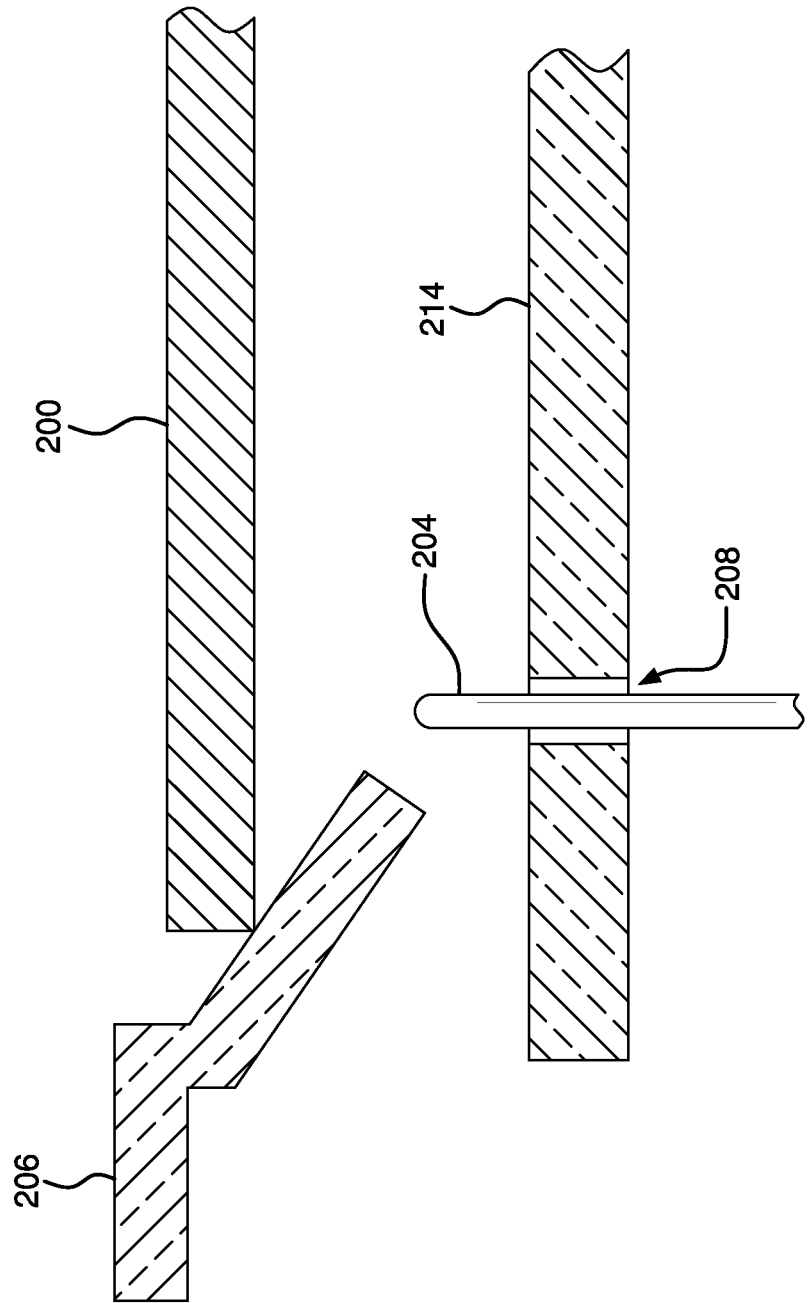
FIG. 3B shows a partial side view of a positioning system according to one embodiment.

FIGS. 3A and 3B also show embodiments of positioning mechanisms. In FIG. 3A, the substrate 200 is loaded into the chamber on the loading blade 202 (also called a robot blade 202). A plurality of lift pins 204 may protrude through the reflector plate 214 and lift the substrate 200 off of the loading blade. This may be accomplished by positioning the lift pins on the outer periphery of the reflector plate 214, and minimizing the planar area of the robot blade 202 so that edges of the substrate 200 overhang at least a portion of the robot blade 202 to allow the lift pins to contact outer peripheral edges of the substrate to lift the substrate off of the robot blade 202. Thus, the robot blade 202 may extend through and between the extended lift pins 204, enabling the robot blade 202 to retract after the pins 204 have lifted the substrate 200 off the robot blade 202. In another variant, the robot blade 202 may have slots or cutouts (not shown) in preselected locations that align with the locations of the lift pins to lift the substrate off of the robot blade. Suitable ways of achieving lift off of the substrate from the robot blade can be found in U.S. Pat. Nos. 6,722,834 and 6,709,218. The holes in the reflector plate 214 are enlarged, allowing the pins to move within the same X-Y plane 210 as the substrate support in the form of an edge ring 206 as well as in a direction perpendicular (shown by arrow 212) to the edge ring 206. The loading blade 202 can then be withdrawn from the chamber. The substrate position sensor system can determine the particular adjustments required to move the substrate 200 position into a pre-selected position, which may be determined empirically in advance. The pre-selected orientation is an orientation in which the substrate 200 is centered with respect to the chamber center, which may be determined by the relative position of the substrate to the substrate support 206 in an X-Y plane. Generally, if the substrate support 206 is centered with respect to the chamber center, when the substrate 200 and substrate support 206 are in a centered orientation, the substrate 200 should be centered in the chamber. The lift pins 204 can then move within the enlarged holes 208 in the reflector plate 214 until the substrate 200 is coaxial with the edge ring 206. Once the substrate 200 is in the desired position, the lift pins 204 can retract, lowering the substrate 200 to the edge ring 206, as shown in FIG. 3B. While it may be desired, holes do not need to be drilled or sculpted in the edge ring 206 as the lift pins 204 do not intersect the edge ring 206.

Alternatively, the lift pins 204 may be stationary in the reflector plate 214. The reflector plate can then move within the same plane 210 as the edge ring 206 as well as perpendicular 212 to the edge ring 206. Allowing the substrate 200 to be positioned on the edge ring 206.

Figure 3C:
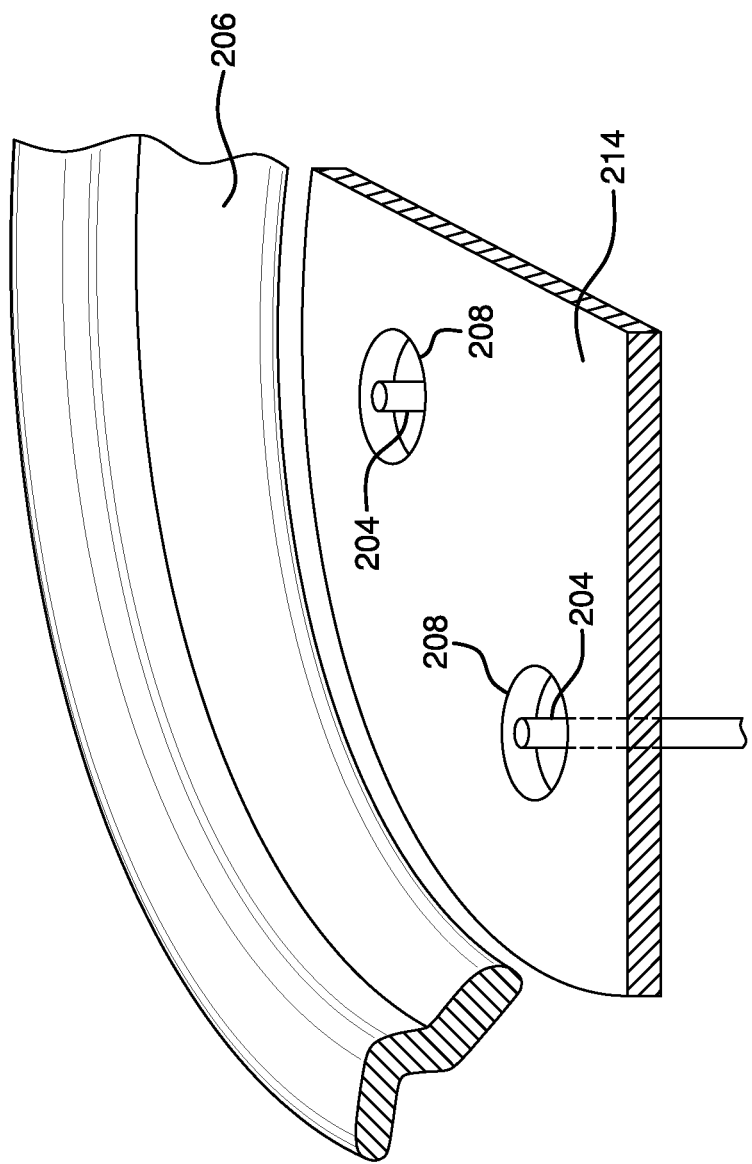
FIG. 3C shows a partial perspective view of a positioning system according to one embodiment.

FIG. 3C shows a cross sectional view of the edge ring 206 and reflector plate 214. It can be seen that the holes 208 in the reflector plate 214 are larger than the diameter of the lift pins 204. This allows the lift pins 204 to move in three-dimensions to adjust the position of a substrate.

Figure 4:
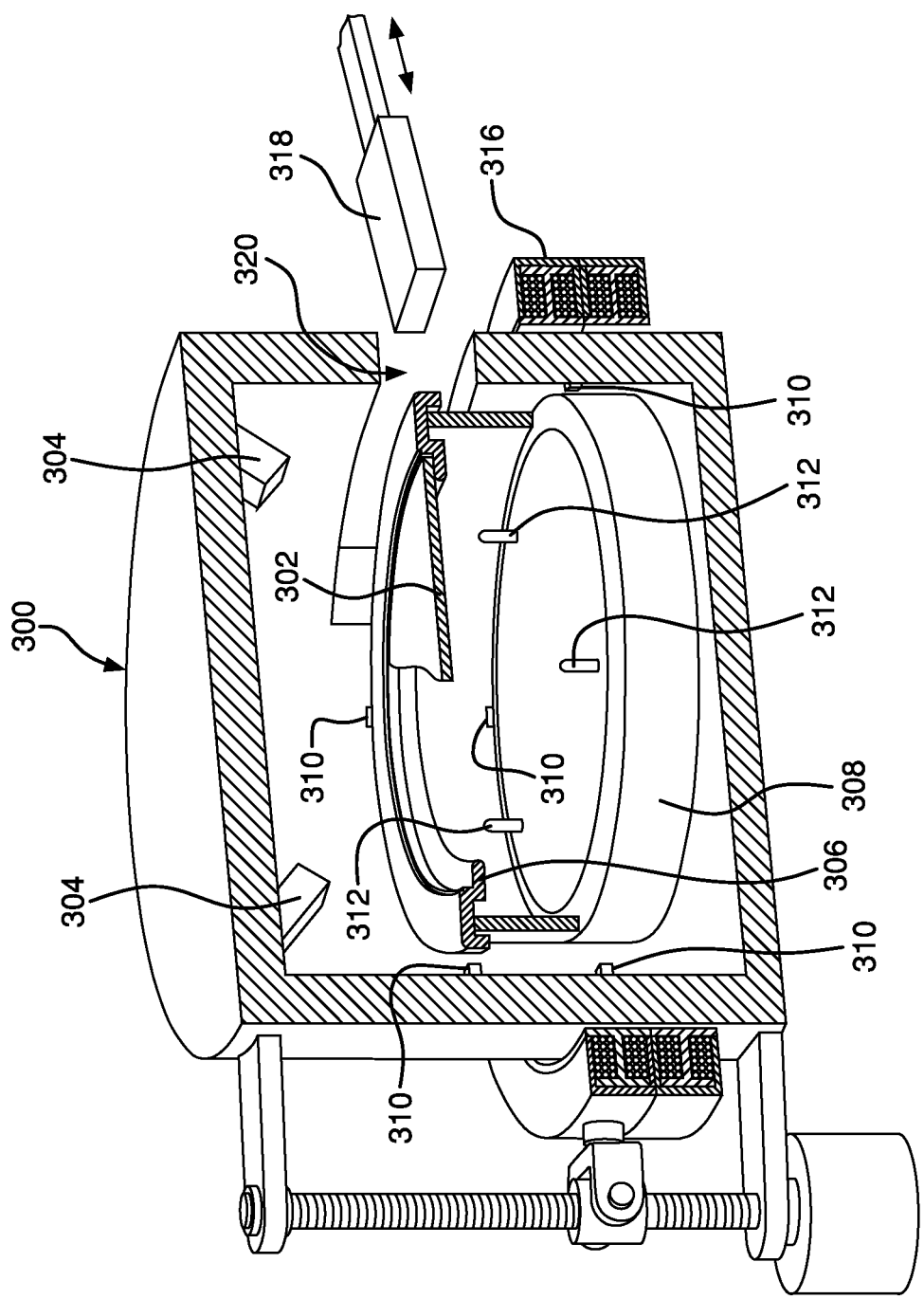
FIG. 4 shows a partial perspective view of a chamber according to an embodiment of the invention.

FIG. 4 shows an exemplary embodiment of a chamber utilizing a positioning mechanism. The substrate 302 is loaded into the chamber 300 on a loading blade 318 through opening 320, and the loading blade 318 supporting the substrate 320 remains in the chamber until an optimal position is obtained as described below. A substrate position sensor system 304 (for example, of the type described in above) can determine if adjustments are necessary to the position of the substrate 302 with respect to the second substrate support 306, which is shown as an edge ring which supports the substrate at the edges of the substrate 302. A computer or other suitable processor in communication with the substrate position sensor system 304 and in communication with a positioning mechanism can then be used to adjust the position of the substrate 302 with respect to the substrate support 306. The adjustments to the edge ring 306 can be made by applying directional force using a radial positioning mechanism that includes pushers 310 that push or move the edge ring 306 in the desired radial direction. Alternatively, a pusher 310 can apply a directional force to the magnetically levitating rotor 308 to move the substrate support 306 in the desired direction. Once the substrate support 306 is positioned coaxially with the substrate 302, the lift pins 312 lift the substrate 302 from the loading blade. After the loading blade is removed, the lift pins 312 can then lower the substrate 302 to the substrate support 306 resulting in coaxially aligned substrate support 306 and substrate 302.

Movement of the edge ring or the magnetically levitated rotor by application of directional force can be accomplished in various other ways. Non-limiting examples of radial positioning mechanisms include a series of positioning rods 310 which push the edge ring 306 or rotor 308; jets of gas or liquid to push the edge ring or rotor; or application of a magnetic field using the stator to cause the edge ring 306 or rotor 308 to move. Any suitable pusher mechanisms, such as screw activated, hydraulically activated or pneumatically activated pusher mechanisms may be used to drive the positioning rods 310.

Figure 5:
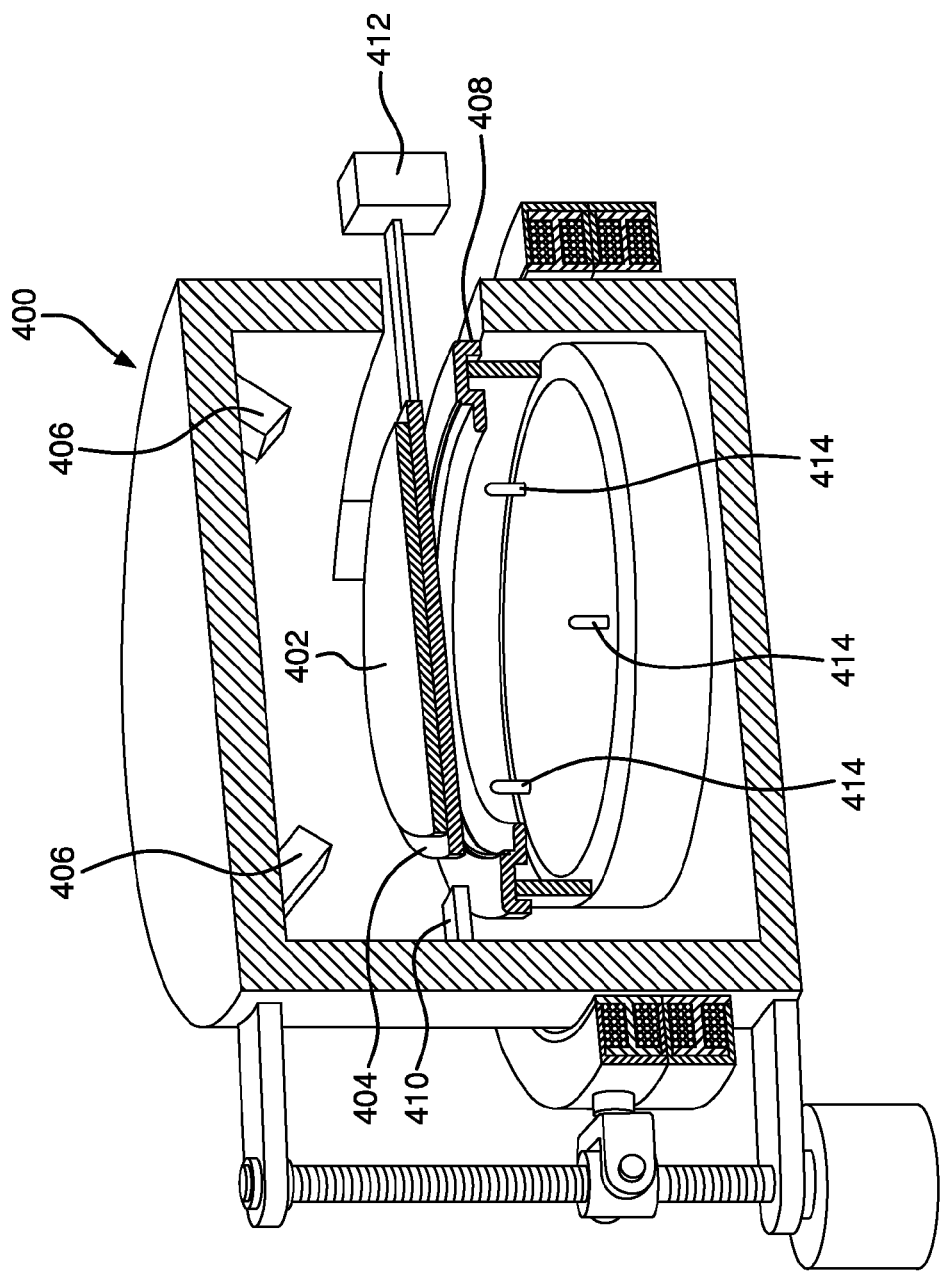
FIG. 5 shows a partial perspective view of a chamber according to an embodiment of the invention.

In another embodiment, as shown in FIG. 5, the substrate 402 is loaded into the chamber 400 on the loading blade 404. A substrate position sensor system 406 (for example, of the type described above) can determine the necessary adjustments to coaxially locate the substrate 402 and edge ring 408. The loading blade 404 can be moved by pushing mechanisms 410 or by motors 412 in communication with the substrate position sensor system 406 via a processor or computer to position the substrate 402. Lift pins 414 lift the substrate 402 from the loading blade 404. Upon removal of the loading blade 404, the lift pins 414 can lower, thereby depositing the substrate 402 onto the edge ring 408 in a coaxial relationship.

Figure 6:
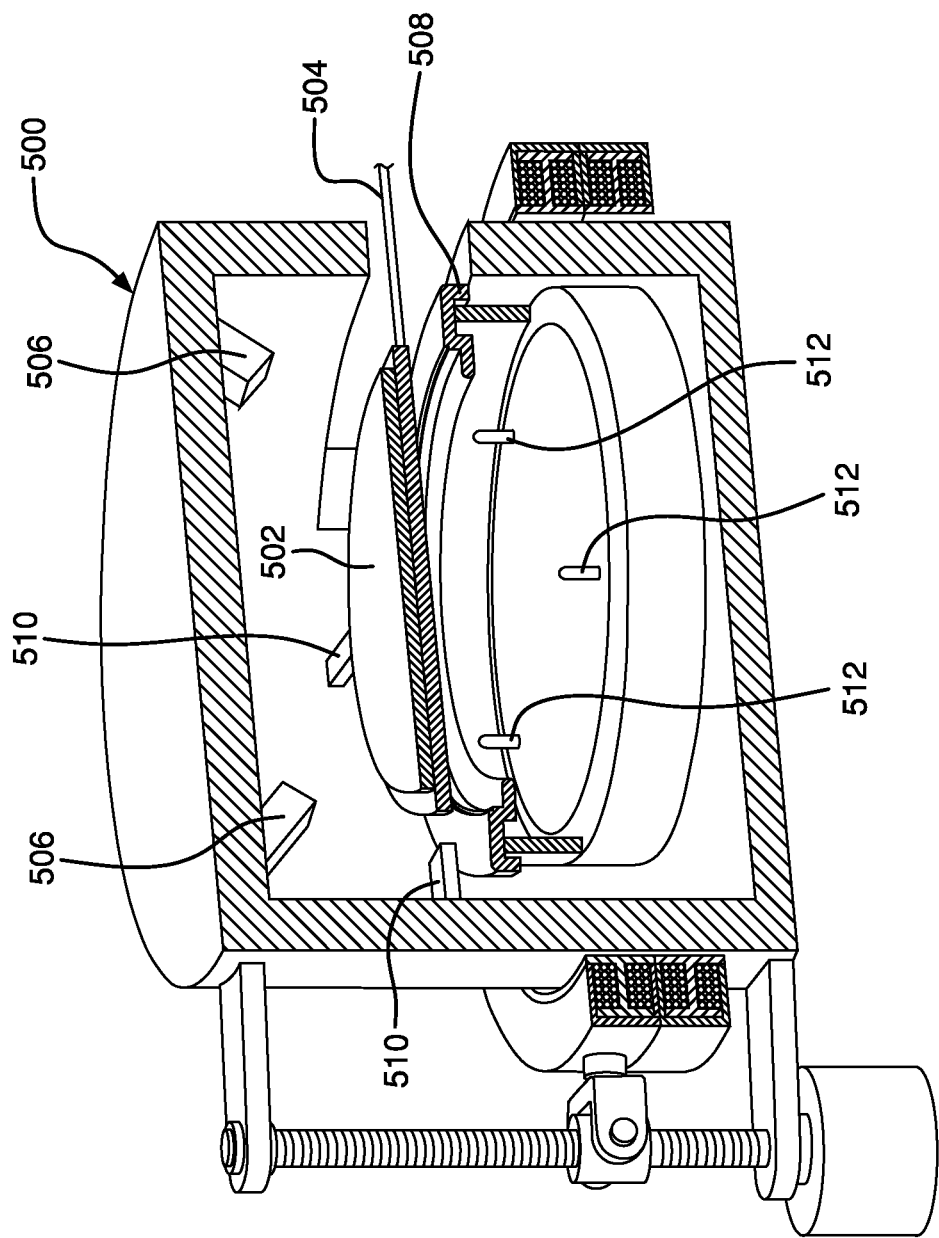
FIG. 6 shows a partial perspective view of a chamber according to an embodiment of the invention.

In a further embodiment, shown in FIG. 6, the substrate 502 is brought into the chamber 500 on the loading blade 504. A substrate position sensor system 506 of the type described above determines the necessary adjustments needed to place the substrate 502 and edge ring 508 in a coaxial relationship. The substrate position sensor system is in communication with a processor or computer and a positioning mechanism. The substrate 502 is then pushed into position using a positioning mechanism selected from one or more of motor driven positioning rods, hydraulic or pneumatic positioning rods, liquid or gas jets, or other similar means 510, while the substrate 502 is on the loading blade 504. These positioning mechanisms can even be located on the blade itself. Once aligned, the lift pins 512 lift the substrate 502 off of the loading blade 504. The loading blade 504 retracts and the lift pins 512 lower the substrate 502 onto the edge ring 508 in a coaxial relationship.

Figure 7:
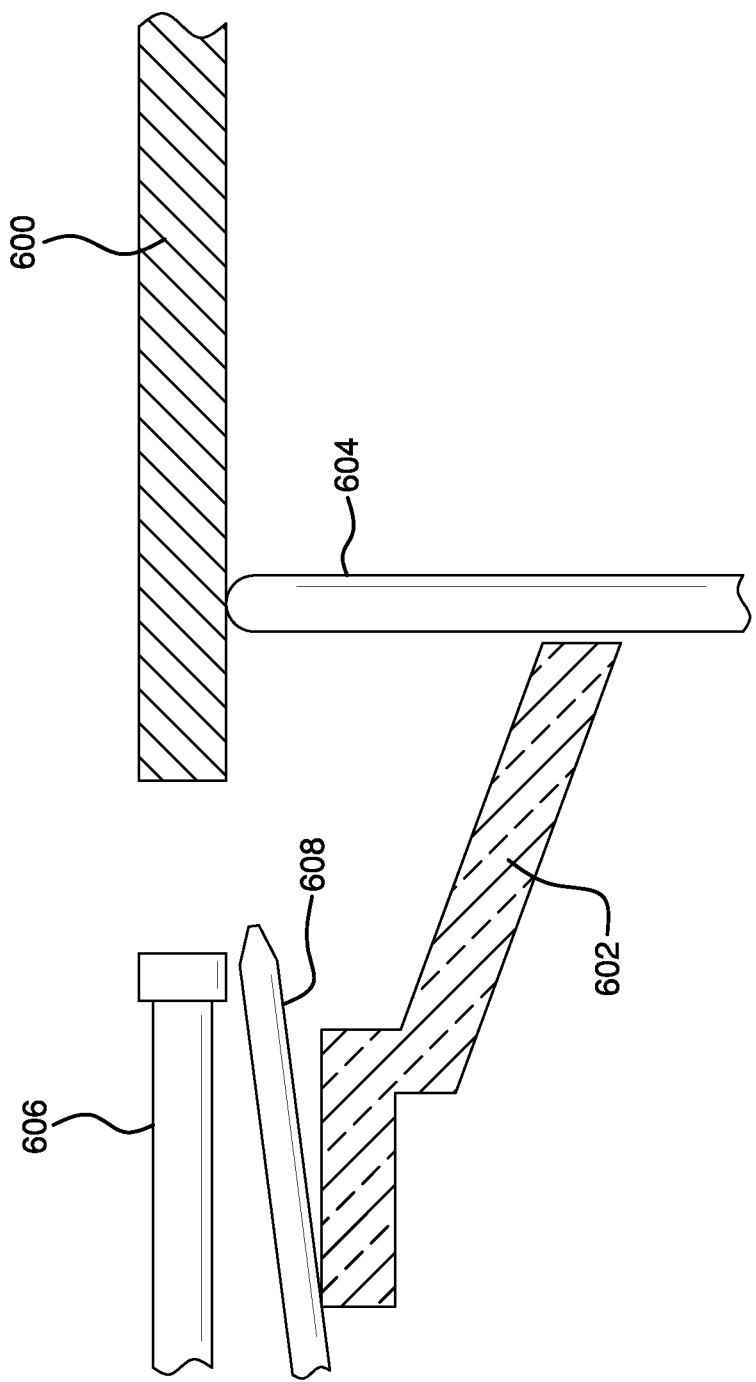
FIG. 7 shows a side view of a positioning mechanism according to one or more embodiments of the invention.

In another embodiment, shown in FIG. 7, the substrate 600 can be coaxially aligned with the edge ring 602 while the substrate 600 is on the lift pins 604. In these embodiments, the substrate 600 can be pushed from the side by any suitable means, including, but not limited to, motor driven positioning rods 606, hydraulic or pneumatic driven positioning rods and/or pressure from gas or liquid jets through nozzles 608. Once aligned, the lift pins 604 retract, lowering the substrate 600 to the edge ring 602 in a coaxially aligned relationship.

Figure 8A:
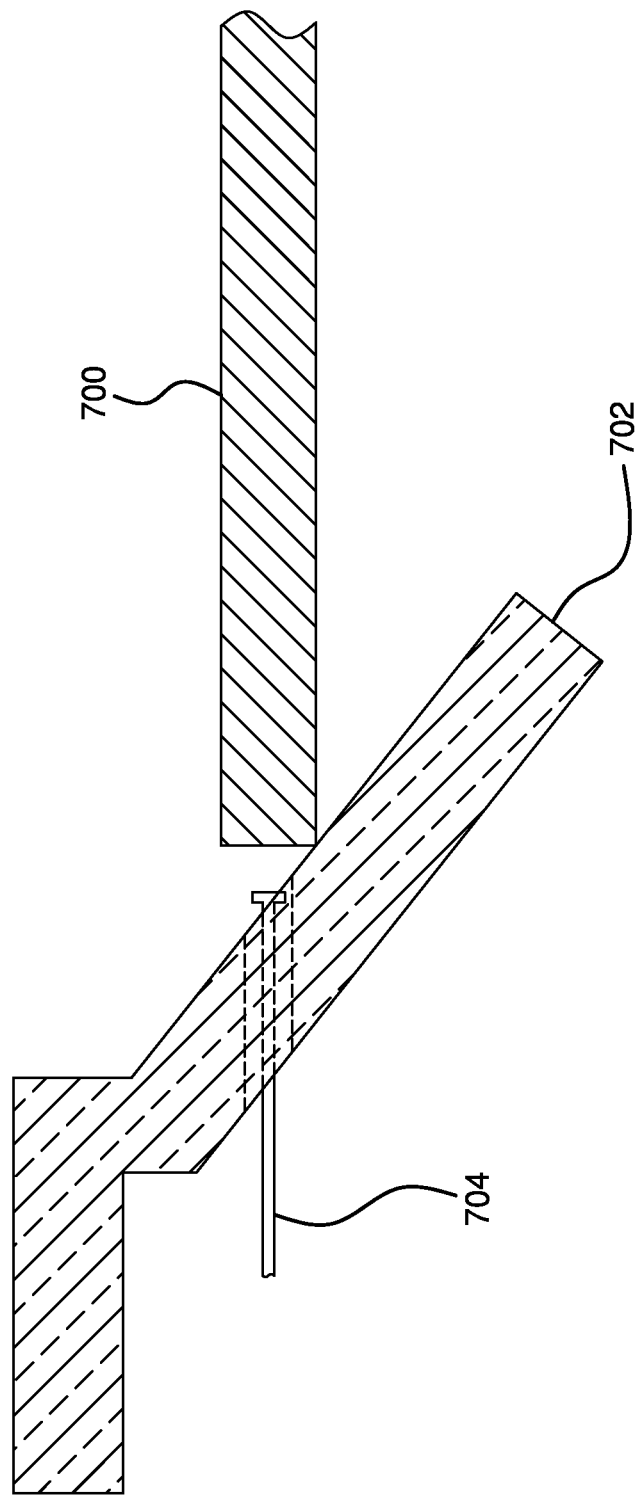
FIG. 8A shows a side view of an embodiment of a positioning mechanism.
Figure 8B:
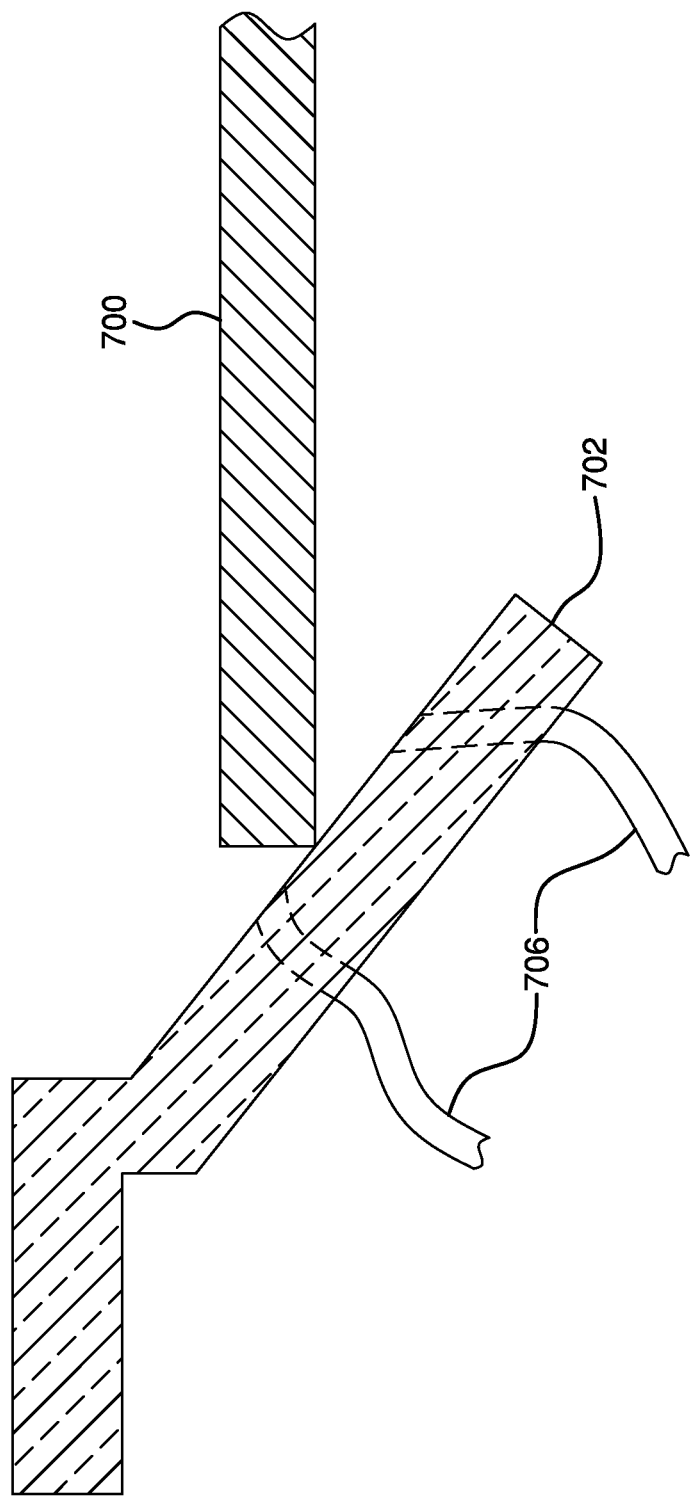
FIG. 8B shows a side view of an embodiment of a positioning mechanism.

Further embodiments, shown in FIGS. 8A and 8B, allow for the coaxial alignment of the substrate 700 with the edge ring 702 after the substrate 700 has been placed on the edge ring 702. This alignment can be accomplished by any suitable means, including, but not limited to, motor driven positioning rods 704, hydraulic or pneumatic driven positioning rods or pressure from gas or liquid jets through nozzles 706. Once coaxially aligned with the edge ring 702, the substrate 700 is ready to be processed.

The apparatus of one or more detailed embodiments is capable of accurately and reproducibly positioning the edge ring and substrate within about ±0.005 inches of being coaxial. In more detailed embodiments, the substrate and edge ring are positioned to be within about ±0.002 inches of being coaxial, or within about ±0.001 inches of being coaxial.

Accordingly, one or more embodiments of the invention are directed to rapid thermal processing apparatus for processing a substrate. The apparatus comprises a chamber including a heat source. The apparatus includes first substrate support, typically in the form of lift pins or a robot blade, for holding the substrate in the chamber in a first position and a second substrate support, for example, an edge ring, for holding the substrate in a second position. The second substrate support, which in specific embodiments comprises an edge ring that supports the substrate at its edges, is adapted to hold the substrate during thermal processing and being moveable in a direction to place the substrate closer and further from the heat source. A sensor system for sensing the axial position of the substrate is included. The sensor system communicates with an actuator which operates to cause the axial position of the substrate relative to the axial position of the second substrate support to be changed. The first substrate support may act as, and be referred to as a temporary substrate support.

Figure 9A:
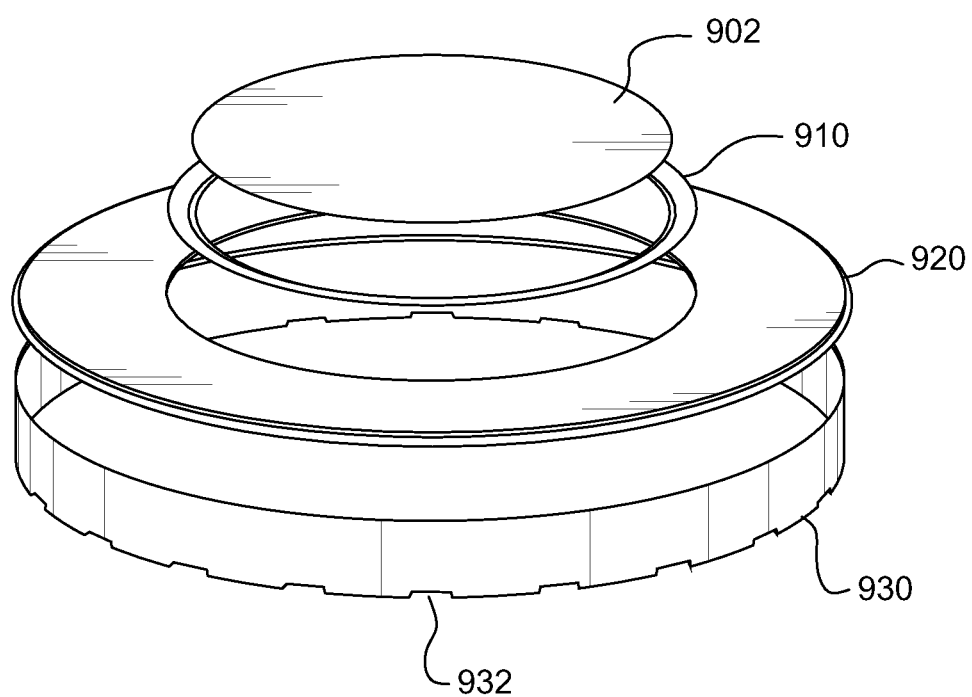
FIG. 9A is a top view of a substrate support according to one or more embodiment of the invention.
Figure 9B:
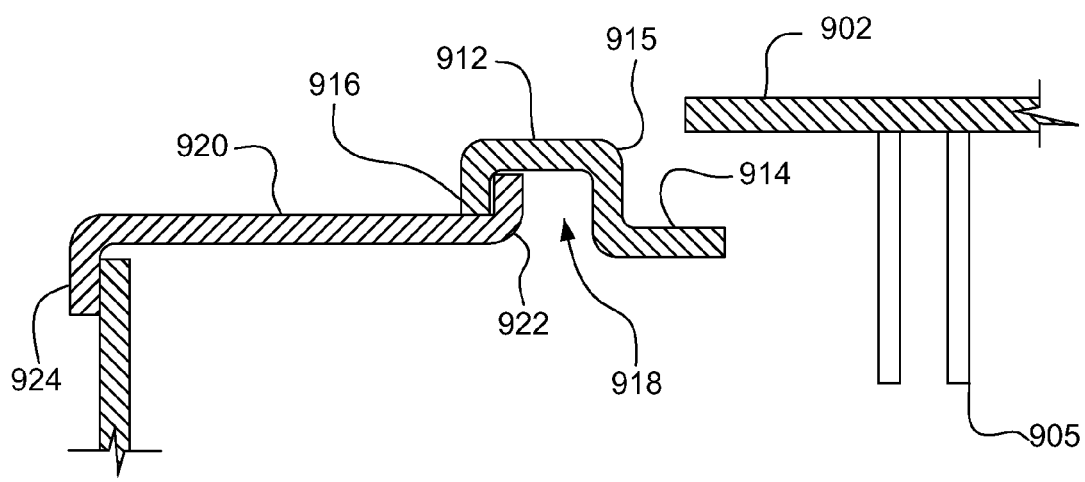
FIG. 9B is a cross sectional view of a substrate support according to one or more embodiment of the invention.

FIG. 9A is a top view of one embodiment of a substrate support 900. FIG. 9B is a cross sectional view of the substrate support 900. The substrate support 900 is formed from the assembly of multiple parts comprising an edge ring 910, a support ring 920, and a support cylinder 930. The edge ring 910 has an annular shape that facilitates the placement of a substrate 902. As shown in FIG. 9B, the edge ring 910 includes an outer surface 912 and an inner surface 914 parallel to and recessed from the outer surface 912. The outer surface 912 is thereby located at a level higher than the inner surface 914, which has an outer border delimited by a sidewall 915. The sidewall 915 may be slightly higher than the thickness of the substrate 902 to facilitate its placement on the inner surface 914. The edge ring 910 may also include an outer flange 916 that extends downward from the outer surface 912. A gap 918 is defined between an outer flange 916 and a sidewall 915 to facilitate the assembly of the edge ring 910 on the support ring 920. In one embodiment, the edge ring 910 may be simply disposed on the support ring 920 without attachment for easy removal and replacement. In detailed embodiments, the second substrate support may be a thin solid recessed disk.

The support ring 920 comprises a thin flat section with an inner flange 922 extending upward and an outer flange 924 extending downward. The inner flange 922 extending upward is coupled to the outer flange 916 of the edge ring 910. The outer flange 924 extending downward is coupled to the support cylinder 930. The support cylinder 930 provides vertical support to the support ring 920. As shown in FIG. 9A, a bottom 932 of the support cylinder 930 may comprise an indented profile that allows for air flow into the support cylinder 930.

Figure 9C:
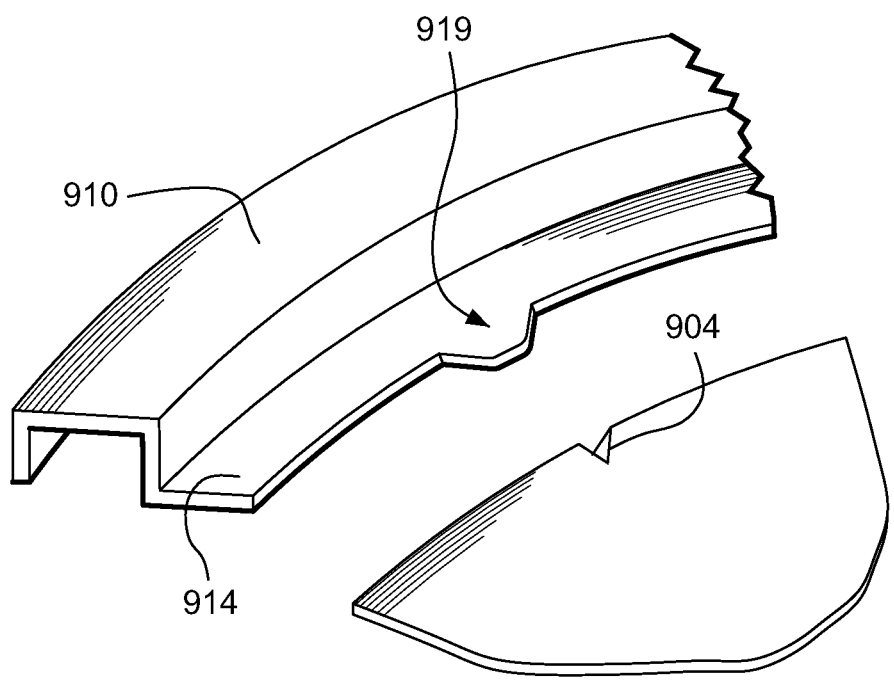
FIG. 9C is a schematic drawing of an edge ring according to one or more embodiment of the invention.

An alternative embodiment of the edge ring 910 is illustrated in FIG. 9C. In this embodiment, the inner surface 914 may also include an alignment mark 919 that may be used to as reference for facilitating the alignment of a corresponding alignment mark 904 provided on the substrate 902. In one embodiment, the alignment mark 919 on the inner surface 914 may be a formed as a protrusion, and the alignment mark 904 on the rim of the substrate 902 may be a notch. Proper alignment and orientation of the substrate 902 on the edge ring 910 may thereby prevent uneven heat distribution owing to light leakage, and improve thermal transfer.

Figure 10A:
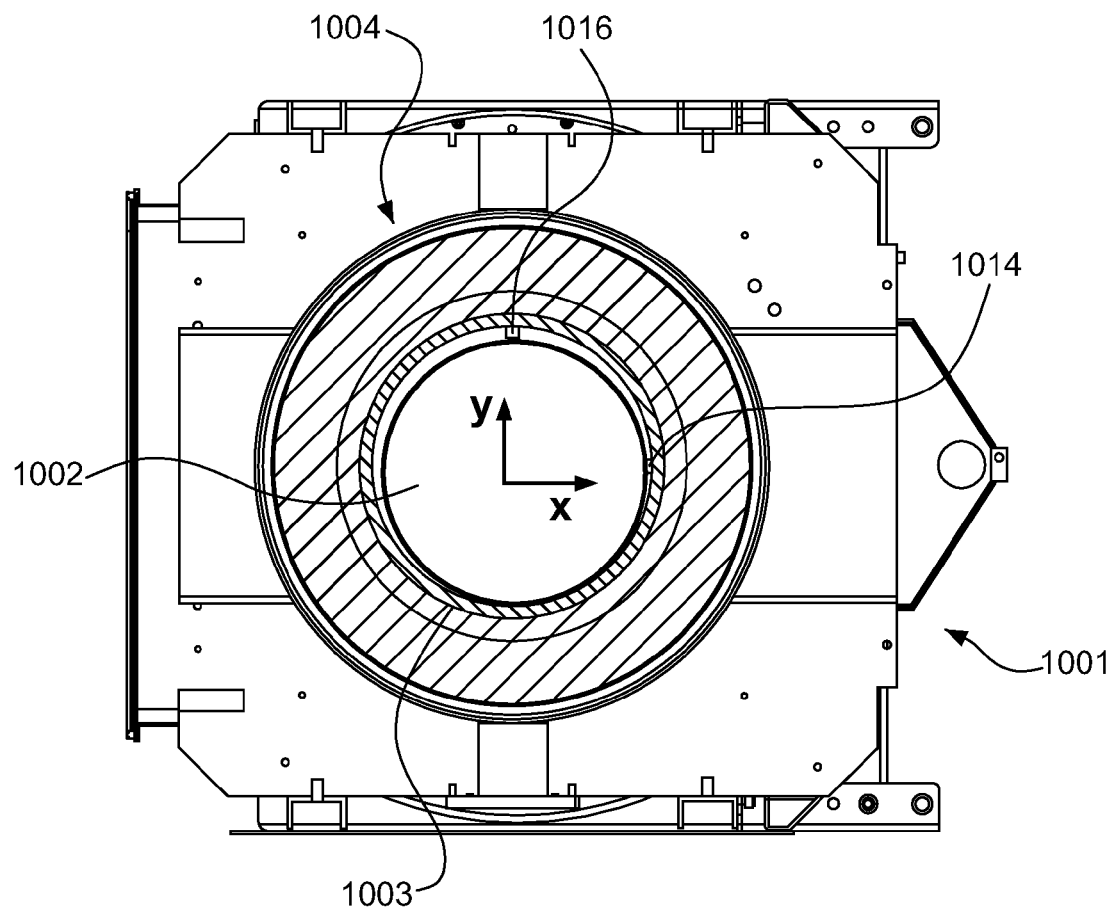
FIG. 10A is a top view of a substrate support within a processing chamber according to one or more embodiment of the invention.
Figure 10B:
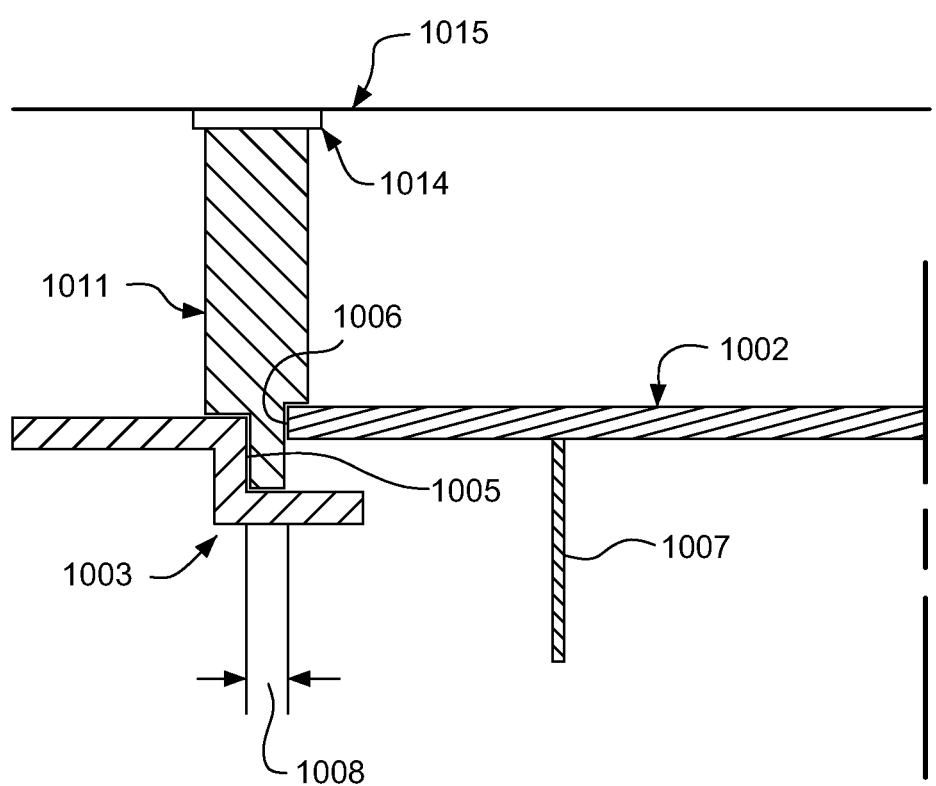
FIG. 10B is a cross sectional view between the edge ring of a substrate support and a substrate according to one or more embodiment of the invention.

As shown in the top view of FIG. 10A and side view of FIG. 10B, position sensors 1014 and 1016 may also be used to ensure that a substrate 1002 is properly centered relative to an edge ring 1003 of the substrate support 1004 within a processing chamber 1001. In one embodiment, the position sensors 1014 and 1016 may be placed above the substrate support 1004, for example by mounting the position sensors 1014 and 1016 proximate to the chamber lid. The position sensors 1014 and 1016 may include ultrasonic sensors, optical sensors, inductive sensors, capacitive sensors, or other type of position sensors capable of detecting a distance between an edge 1006 of the substrate 1002 and a sidewall 1005 of the edge ring 1003. In another embodiment, the position sensors 1014 and 1016 may emit light beams to detect any improper centering of the substrate 1002 relative to the edge ring 1003.

As shown in FIG. 10B, the substrate 1002 may be placed on the edge ring 1003 by lowering support pins 1007. To supply the substrate 1002 with a uniform thermal treatment across the substrate surface, the substrate 1002 may be positioned on the center of the edge ring 1003. The edge ring 1003 may be adjusted to meet the substrate 1002 by moving the substrate support 1004 in the direction of an X and a Y axis. To find the center position of the edge ring 1003 for the substrate 1002 to be positioned, the position sensors 1014 and 1016 may be positioned in different locations to help detect for the center position. In one embodiment, position sensors 1014 may be mounted on the chamber lid 1015 relative to a spot between edge 1006 of the substrate 1002 and sidewall 1005 of the edge ring 1003 as shown in FIG. 10B. In each spot is a distance 1008 between edge 1006 of the substrate 1002 and sidewall 1005 of the edge ring 1003. Each spot may correspond to an axis and a distance relative to the specific axis. For example, the spot for position sensor 1014 may correspond to the X axis and the spot for position sensor 1016 may correspond to the Y axis. Each spot may contain a distance 1008 which may be measured by the position sensors 1014 and 1016. In one embodiment, the position sensors 1014 and 1016 may emit a light beam 1011 to detect for the distance 1008 within the spot. In another embodiment, the reflective light beam 1011 may be a round spot or a line. In yet another embodiment, the spot size of the round spot or the line may be no less than 4.5 mm. In still another embodiment, the reflective light beam 1011 may be transmitted within a range from about 25-50 mm. The distance 1008 measured at each spot may be compared to find a theta adjustment value. In one embodiment, the accuracy for the distances measured may have a range of about ±10 μm or better. The theta adjustment value contains an adjustable distance for the X axis and an adjustable distance for the Y axis. The adjustable distances are adjustments required for the edge ring 1003 to be moved into the center position in the X and Y axis. After the theta adjustment value has been obtained, the edge ring 1003 may then be adjusted to move to a proper position. Signal then may be sent to the robotic arm to pick up the substrate 1002 from the support pins 1007 and transfer the substrate 1002 to a proper position on the substrate support 1004 for thermal treatment. In one embodiment, the distance from the substrate to the edge ring has a range of about 0 to 4.342 mm. In a specific embodiment, the distance from the substrate to the edge ring is at about 2.171 mm. In detailed embodiments, the theta adjustment value is associated with adjustment information relating to a Z position which may be adjusted through vertical movement.

Figure 10C:
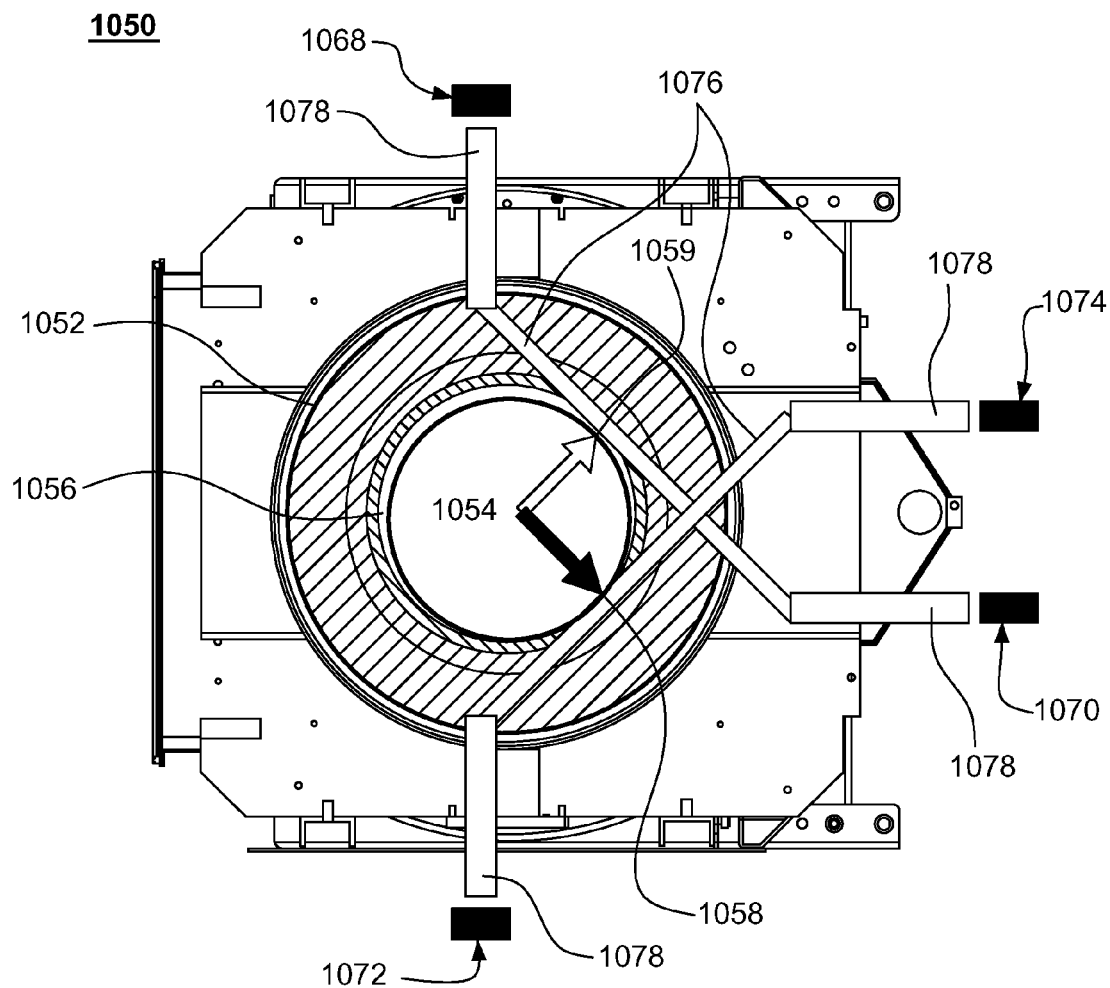
FIG. 10C is a top view of a substrate support within a processing chamber according to one or more embodiment of the invention.

FIG. 10C is a top view of a substrate support 1052 within a processing chamber 1050 according to another embodiment of the invention. Alternatively, the distance 1008 between the edge ring 1056 and the substrate 1054 may also be measured by placing the sensors at the inner sidewalls of the processing chamber 1050. In one embodiment, a first light transmitter 1068 may be coupled to one side of the inner sidewall, and a first light receiver 1070 may be coupled to a sidewall adjacent to the sidewall where the first light transmitter 1068 is positioned to measure for a distance 1058 that corresponds to the X axis. A second light transmitter 1072 may be coupled to another inner sidewall, and a second light receiver 1074 may be coupled to a sidewall adjacent to the inner sidewall where the second light transmitter 1072 is positioned to measure for a distance 1059 that corresponds to the Y axis. The distances 1058 and 1059 may be measured by light beams 1076 transmitted by the light transmitters 1068 and 1072 through a light pipe 1078. The light beams 1076 may pass through distances 1058 and 1059 between the edge ring 1056 and the substrate 1054, and may be received by the light receivers 1070 and 1074. After distances 1058 and 1059 have been obtained and send back to system controller 1124, theta adjustment value may now be calculated and the edge ring 1003 may then be adjusted according to the theta adjustment value by moving in the direction of X and Y axis to a center position where the substrate may be positioned in.

Figure 11:
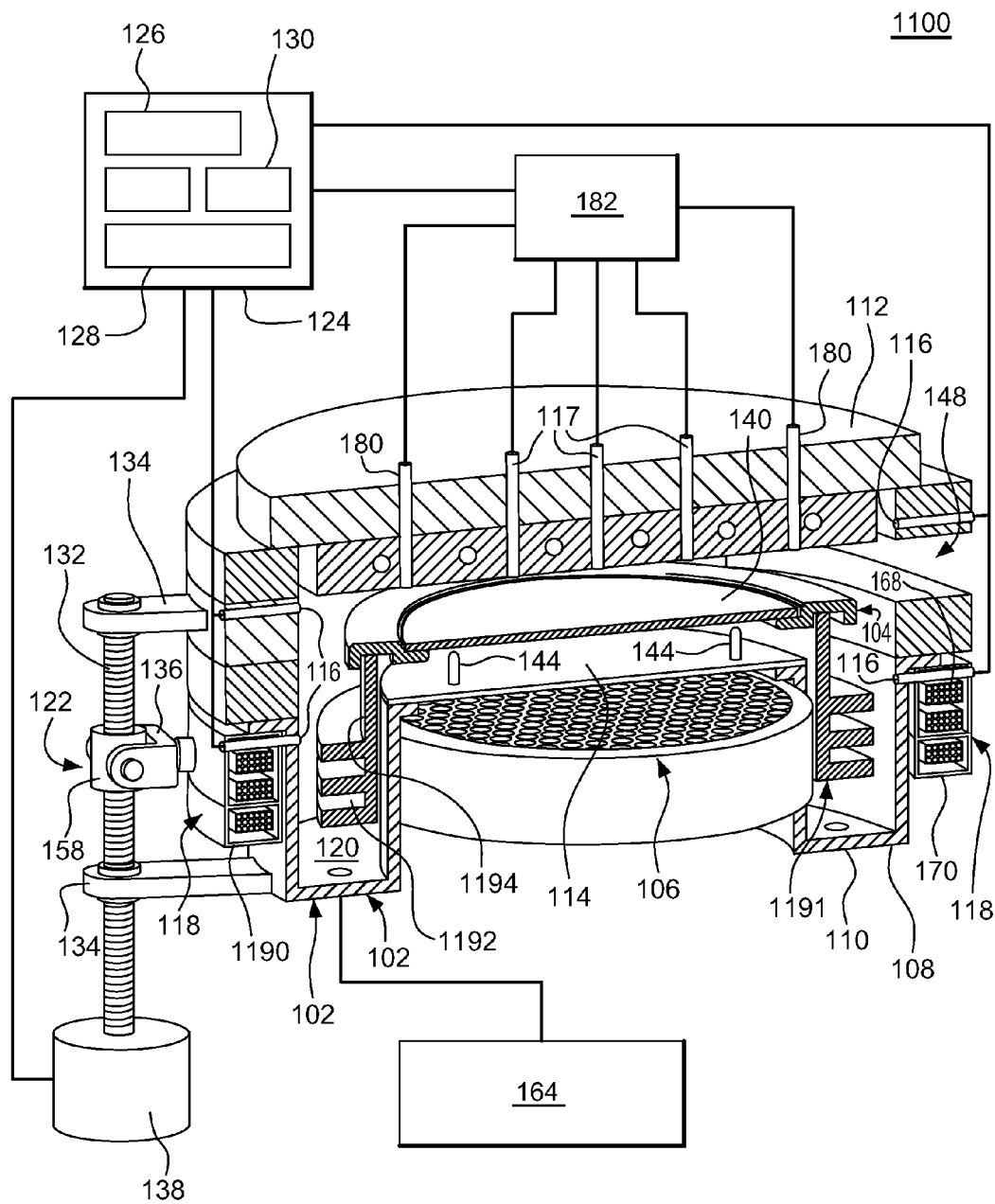
FIG. 11 is a simplified isometric view of a rapid thermal processing chamber according to one or more embodiment of the invention.

FIG. 11 shows a simplified isometric view of a detailed embodiment of a rapid thermal processing chamber 1100. The processing chamber 1100 includes the components described with respect to FIG. 1, and the reference numerals are consistent for the equivalent components. The chamber 1100 includes one or more sensors 116, which are generally located outside the chamber and adapted to detect the elevation of the substrate support 104 (or substrate 140) within the interior volume 120 of the chamber body 102. The sensors 116 may be coupled to the chamber body 102 through tubular ports as shown and/or other portions of the processing chamber 1100 and are adapted to provide an output indicative of the distance between the substrate support 104 and the top 112 and/or bottom 110 of the chamber body 102, and may also detect misalignment of the substrate support 104 and/or substrate 140. In another embodiment (not shown), the sensors 116 can be placed inside the stator housing 1190, which would allow the sensors 316 to move with the stator 118 up and down. This embodiment would permit the sensors 116 to obtain a reference point on the ring section 192. In such an embodiment, the signal would likely be constant and would look for a deviation of the signal, and vertical position could be determined from feedback from the motor 138.

The one or more sensors 116 are coupled to the controller 124 that receives the output metric from the sensors 116 and provides a signal or signals to the one or more actuator assemblies 122 to raise or lower the substrate support 104. The controller 124 may utilize a positional metric obtained from the sensors 116 to adjust the elevation of the stator 118 at each actuator assembly 122 so that both the elevation and the planarity of the substrate support 104 and substrate 140 seated thereon may be adjusted relative to the central axis of the chamber 100 and/or the radiant heat source 106. For example, the controller 124 may provide signals to raise the substrate support by action of the actuator 122 to correct axial misalignment of the substrate support 104, or the controller may provide a signal to all actuators 122 to facilitate simultaneous vertical movement of the substrate support 104.

The sensors 116 may be coupled to the walls 108, although other locations within and around the chamber body 102 may be suitable, such as coupled to the stator 118 outside of the chamber 1100. In one embodiment, one or more sensors 116 may be coupled to the stator 118 and are adapted to sense the elevation and/or position of the substrate support 104 (or substrate 140) through the walls 108. In these embodiments the walls 108 may include a thinner cross-section to facilitate positional sensing through the walls 108.

The substrate support 104 of FIG. 11 includes an annular body 1191 having an inside diameter sized to receive the radiant heat source 106 and other hardware (not shown). The substrate support 104 is at least partially comprised of a magnetic ring section 1192 and a support section 1194. The magnetic ring section 1192 may be at least partially comprised of a magnetic material, such as a ferrous containing material, to facilitate magnetic coupling of the substrate support 104 to the stator 118. The ferrous containing material includes low carbon steel, stainless steel, which may include a plating, such as nickel. In one embodiment, the magnetic ring section 1192 is comprised of a plurality of permanent magnets disposed in a polar array about a central axis. The magnetic ring section 1192 may additionally include an outer surface having one or more channels formed therein. In one embodiment, the magnetic ring section 1192 includes a shaped profile, such as an "E" shape or a "C" shape having one or more channels formed therein.

According to one or more embodiments, it is possible to center the substrate 140 on the edge ring 104 by adjusting the position of the magnetically levitated substrate support 104 so it is co-axial with the substrate 140 on the lift pins 144 before lifting the substrate 140. A feedback system including a set of optical sensors 116 or a vision system in communication with the system controller 124 can be used to achieve centering of the substrate. Placement of the substrate 140 could be done using feedback from such system. The stator 118 can be used to center the edge ring 104 beneath the substrate 140 to with high precision, for example, 0.001" or better, and can compensate for up to 0.010" of displacement.

Figure 12:
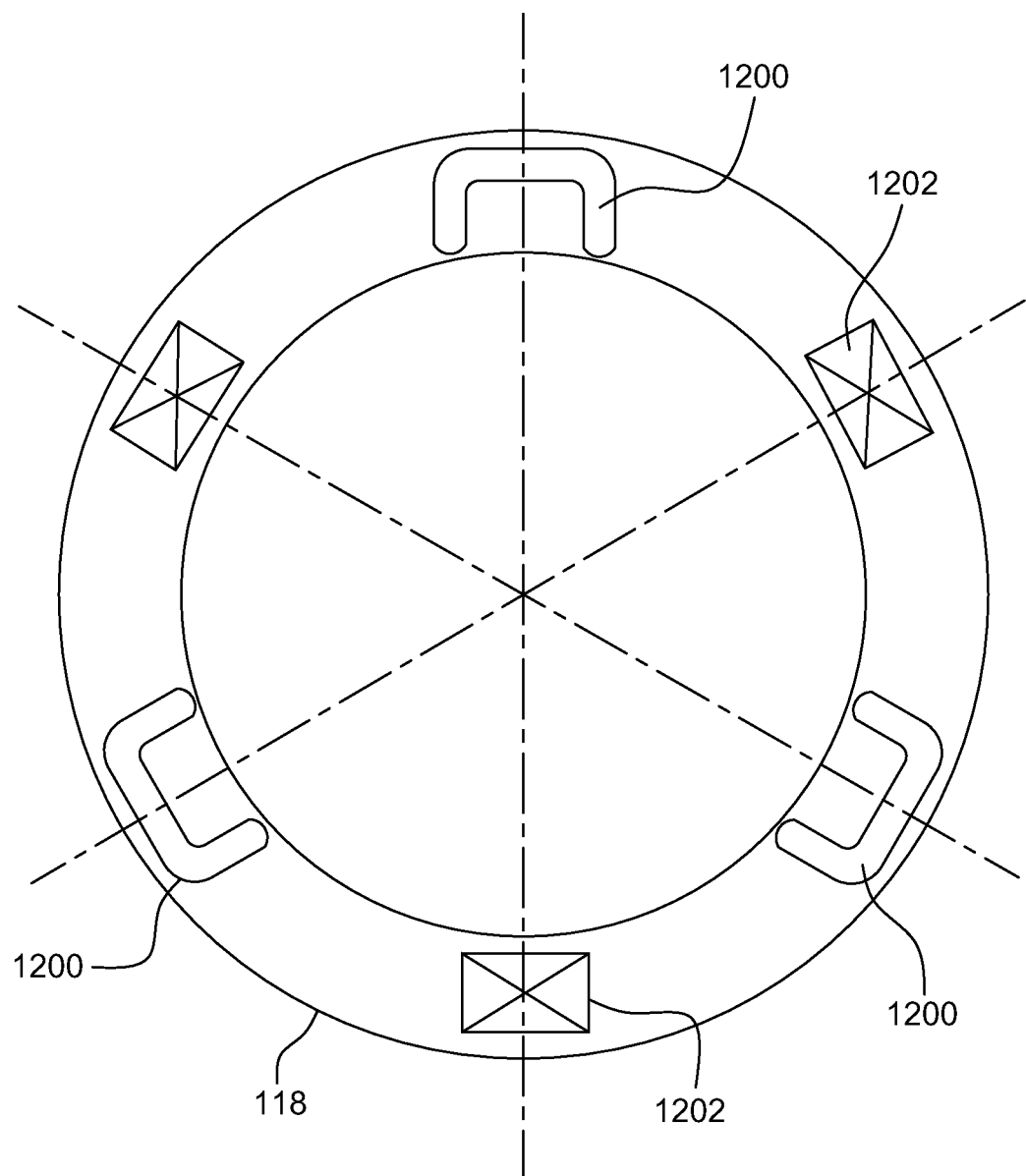
FIG. 12 is a top view of a stator assembly with the housing removed according to one or more embodiments of the invention.

One or more embodiments of the invention have a robot (not shown) which brings the substrate 140 into chamber 1100, where it is transferred onto the lift pins 144. The substrate support 104 is centered beneath the substrate 140 using variable magnetic fields generated by the stator 118, which changes the position of the substrate support in the chamber the substrate support 104. FIG. 12 shows a top view of an embodiment of the stator assembly 118 with the housing removed. The magnetic field strength of a series of electromagnets 1200, which are in communication with the system controller, can be adjusted to create an electromagnetic bias, which can push/pull a substrate support within the chamber. At least one electromagnet can be biased to push the substrate support, and at least one electromagnet can be biased to pull the substrate support. By adjusting the strength of the magnetic field of the electromagnets 1200 located at various locations around the stator 118, the substrate support can be accurately positioned. Sensors 1202, which can be eddy current sensors, in communication with the system controller 124 can be employed to detect the position of the substrate support within the chamber, thereby providing feedback in the form of position signals to the system controller 124. The feedback from these sensors 1202 can be evaluated by the system controller 124, which, in turn can provide a signal to bias one or more of the electromagnets to adjust the position of the substrate support.

FIG. 12 shows the electromagnets 1200 and sensors 1202 located at positions approximately 120° apart. This is illustrative only, and should not be taken as limiting the invention. Any suitable number of sensors and electromagnets can be employed. For example, six electromagnets can be controlled by the system controller 124 with feedback originating from three sensors.

Further embodiments of the invention are directed to methods of processing a substrate. The method comprises transferring a substrate into a processing chamber. The substrate is transferred to an intermediate substrate support, which may be, for example, a set of lift pins. The location of the substrate is determined, for example by detecting one or more substrate edges. The position of the substrate relative to a substrate support is adjusted so that the substrate and the substrate support are aligned in a preselected relative orientation. The substrate position sensor system communicates through a central processing unit, for example, a general purpose computer, with the positioning mechanism, which makes the desired adjustment of to the position of the substrate relative to the substrate support. A feedback control system can be used to ensure that the relative position of the substrate and the substrate support is optimized until the substrate and substrate support are in substantial coaxial alignment. The substrate is transferred to the second substrate support, which may be an edge ring. The substrate is then ready to be processed. The prescribed relative orientation may be axial alignment of the substrate with the edge ring, or alignment of the substrate with the edge ring based on an empirically determined position. For example, the empirically determined position may not align the substrate and edge ring coaxially, but may align the thermal center of mass of the substrate with the center of the edge ring.

The substrate may be transferred into the processing chamber using a robot blade. The intermediate support may be a plurality of lift pins located on a lift pin assembly. Other methods of introducing the substrate to the chamber and providing intermediate support are also within the scope of this invention.

The order of these steps varies depending on the particular embodiment of use and should not be taken as a strict procedural sequence. In some embodiments, the relative position of the substrate with respect to the edge ring is adjusted prior to transferring the substrate onto the lift pins. In other embodiments, the relative position with respect to the edge ring is adjusted after transferring the substrate to the lift pins. In various embodiments, the relative position of the substrate with respect to the edge ring is adjusted by changing one or more of the location of the substrate, the location of the edge ring or the location of the lift pins.

Detailed embodiments are directed to methods for concentric positioning of a substrate on a levitating substrate support. A substrate is transferred into a processing chamber and placed onto a temporary support element. The substrate position relative to a substrate support is measured using sensors. The position of the substrate support is adjusted to bring the substrate support into concentric alignment with the substrate. The substrate is transferred from the temporary support element to the substrate support.

In specific embodiments, concentric positioning of the substrate on the support comprises biasing at least one magnet to pull the substrate support or push the substrate support.

Further specific embodiments are directed to a substrate processing apparatus comprising a chamber, a substrate support, a position sensor and a system controller. The substrate support is disposed in the chamber and comprises an annular body configured to support the substrate on an upper surface thereof. The substrate support is magnetically coupled to a plurality of electromagnets disposed adjacent the substrate support. The position sensor can detect the substrate position relative to the substrate support. The system controller is in communication with the electromagnets and is operative to bias at least one of the electromagnets to move (i.e., push or pull) the substrate support relative to the substrate.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A rapid thermal processing apparatus comprising:
   a chamber including a heat source;
   a first substrate support in the processing chamber in a first position so that when a substrate is present, the first substrate support holds the substrate in the chamber in a first position;
   a second substrate support in a second position, the second substrate support being movable in a direction to move the second substrate support closer and further from the heat source;
   a sensor to sense the position of the substrate, when present, relative to the second substrate support, the sensor comprising,
      a light source to direct light onto a surface of the substrate to cast a shadow on the second substrate support or to direct light onto the second substrate support to cast a shadow on the substrate, and
      an optical detector to monitor the shadow, and
      an electronic controller in communication with the optical detector, the electronic controller determining the edge or center of the substrate; and
   an actuator in communication with the sensor to change the position of the substrate, when present, relative to the position of the second substrate support.

2. The apparatus of claim 1, wherein the optical detector comprises a camera, an illumination system and a vision image analysis system which detects centers of the second substrate support and substrate.

3. The apparatus of claim 1, further comprising liquid or gas jets positioned adjacent the substrate support so that when a substrate is present the jets move the substrate in a plurality of axial directions.

4. The apparatus of claim 1, further comprising a plurality of positioning rods oriented in the same plane as the substrate, so that when a substrate is present, the positioning rods can contact the edge of the substrate to push the substrate in a plurality of directions within the plane of the substrate.

5. The apparatus of claim 1, further comprising a magnetically levitated rotor coupled to the second substrate support and a magnetic field generating device coupled to the magnetically levitated rotor, the magnetic field being modifiable to move the levitated rotor in a plurality of axial directions.

6. The apparatus of claim 1, further comprising a system controller to obtain position signals from the sensor and to send a signal to one or more electromagnets to adjust the position of the second substrate support relative to the substrate.

7. The apparatus of claim 1, wherein second substrate support comprises an edge ring including an alignment mark on an inner surface of the substrate support to be aligned with a corresponding alignment mark on the substrate.

8. The apparatus of claim 1, wherein when a substrate is present, the light source directs light onto the substrate to cast a shadow on the second substrate support and the optical detector monitors the shadow on the second substrate support.

9. The apparatus of claim 1, wherein when a substrate is present, the light source directs light onto the second substrate support to cast a shadow on the support and the optical detector monitors the shadow on the substrate.

10. A rapid thermal processing apparatus comprising:
    a chamber including a heat source;
    a first substrate support in the processing chamber in a first position to hold the substrate in the chamber in a first position;
    a second substrate support in a second position, the second substrate support being movable in a direction to move closer and further from the heat source;
    a sensor to sense the position of the substrate relative to the second substrate support, the sensor comprising,
       a light source to direct light at the substrate to cast a shadow on the second substrate support,
       an optical detector to monitor the shadow on the second substrate support, the optical detector comprising a camera and a vision image analysis system, and
       an electronic controller in communication with the optical detector, the electronic controller determining the center of the substrate; and
    an actuator in communication with the sensor to change the position of the substrate, when present, relative to the position of the second substrate support.

11. The apparatus of claim 10, further comprising liquid or gas jets positioned adjacent the substrate support so that when a substrate is present the jets move the substrate in a plurality of axial directions.

12. The apparatus of claim 10, further comprising a plurality of positioning rods oriented in the same plane as the substrate, so that when a substrate is present, the positioning rods can contact the edge of the substrate to push the substrate in a plurality of directions within the plane of the substrate.

13. The apparatus of claim 10, further comprising a magnetically levitated rotor coupled to the second substrate support and a magnetic field generating device coupled to the magnetically levitated rotor, the magnetic field being modifiable to move the levitated rotor in a plurality of axial directions.

14. The apparatus of claim 10, further comprising a system controller to obtain position signals from the sensor and to send a signal to one or more electromagnets to adjust the position of the second substrate support relative to the substrate.

15. The apparatus of claim 10, wherein second substrate support comprises an edge ring including an alignment mark on an inner surface of the substrate support to be aligned with a corresponding alignment mark on the substrate.

16. A rapid thermal processing apparatus comprising:
a chamber including a heat source;
a first substrate support in the processing chamber in a first position to hold the substrate in the chamber in a first position;
a second substrate support in a second position, the second substrate support being movable in a direction to move closer and further from the heat source;
a sensor to sense the position of the substrate relative to the second substrate support, the sensor comprising,
a light source to direct light at the second substrate support to cast a shadow on the substrate,
an optical detector to monitor the shadow on the substrate, the optical detector comprising a camera and a vision image analysis system, and
an electronic controller in communication with the optical detector, the electronic controller determining the center of the substrate; and
an actuator in communication with the sensor to change the position of the substrate, when present, relative to the position of the second substrate support.

17. The apparatus of claim 16, further comprising liquid or gas jets positioned adjacent the substrate support so that when a substrate is present the jets move the substrate in a plurality of axial directions.

18. The apparatus of claim 16, further comprising a plurality of positioning rods oriented in the same plane as the substrate, so that when a substrate is present, the positioning rods can contact the edge of the substrate to push the substrate in a plurality of directions within the plane of the substrate.

19. The apparatus of claim 16, further comprising a magnetically levitated rotor coupled to the second substrate support and a magnetic field generating device coupled to the magnetically levitated rotor, the magnetic field being modifiable to move the levitated rotor in a plurality of axial directions.

20. The apparatus of claim 16, wherein second substrate support comprises an edge ring including an alignment mark on an inner surface of the substrate support to be aligned with a corresponding alignment mark on the substrate.

* * * * *